United States Patent
Lee et al.

(10) Patent No.: US 7,678,473 B2
(45) Date of Patent: Mar. 16, 2010

(54) ORGANOMETALLIC COMPLEX AND ORGANIC ELECTROLUMINESCENT DEVICE USING THE SAME

(75) Inventors: Jong-Hyoup Lee, Seoul (KR); Seok Chang, Duejeon-si (KR); Das Rupasree Ragini, Suwon-si (KR); Hee-Kyung Kim, Anyang-si (KR); Lyong-Sun Pu, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 973 days.

(21) Appl. No.: 11/346,585

(22) Filed: Feb. 3, 2006

(65) Prior Publication Data

US 2006/0172150 A1    Aug. 3, 2006

(30) Foreign Application Priority Data

Feb. 3, 2005    (KR) ...................... 10-2005-0010182

(51) Int. Cl.
*H01L 51/54* (2006.01)
*C09K 11/06* (2006.01)

(52) U.S. Cl. .......................... 428/690; 428/917; 546/6; 548/101; 257/102; 257/E51.044; 313/504; 313/506

(58) Field of Classification Search .............. 428/690, 428/917; 313/504, 506; 257/40, 102, E51.044; 546/4, 6; 548/101, 103, 108
See application file for complete search history.

(56) References Cited

U.S. PATENT DOCUMENTS

2002/0064681 A1    5/2002    Takiguchi et al.
2002/0182441 A1    12/2002   Lamansky et al.
2005/0031903 A1*   2/2005    Park et al. .................... 428/690
2006/0078760 A1*   4/2006    Ragini et al. ................. 428/690
2006/0240282 A1*   10/2006   Lin ............................ 428/690

FOREIGN PATENT DOCUMENTS

WO    WO 02/15645 A1    2/2002

OTHER PUBLICATIONS

M. A. Baldo et al., "Excitonic singlet-triplet ratio in a semiconducting organic thin film", Physical Review B, vol. 60, No. 20, pp. 14 422, Nov. 15, 1999-II.
Hae Won Lee et al., "Electrophosphorescent Light Emitting Devices Using Mixed Ligand Ir(III) Complexes", Mat. Res. Soc. Symp. Proc. vol. 708, pp. BB3.38.1-5, 2002.
M. A. Baldo et al., "Highly efficient phosphorescent emission from organic electroluminescent devices", Nature, vol. 395, Sep. 10, 1998, pp. 151-154.

* cited by examiner

*Primary Examiner*—D. Lawrence Tarazano
*Assistant Examiner*—Michael Wilson
(74) *Attorney, Agent, or Firm*—Robert E. Bushnell, Esq.

(57) ABSTRACT

Provided is an organometallic complex that highly effectively emits a phosphorescent light and an organic electroluminescent device using the same. The organometallic complex can be used to form an organic layer of an organic electroluminescent device, is a highly effective phosphorescent material emitting light of 400 nm to 650 nm, and can be used with a green emission material or a red emission material to emit a white light. In addition, the organometallic complex can be used in a solution process due to its high solubility, and thus, is suitable for large-scale screens.

20 Claims, 6 Drawing Sheets

ORGANOMETALLIC COMPLEX AND ORGANIC ELECTROLUMINESCENT DEVICE USING THE SAME

CROSS-REFERENCE TO RELATED PATENT APPLICATIONS AND CLAIM OF PRIORITY

This application claims the benefit of Korean Patent Application No. 10-2005-0010182, filed on Feb. 3, 2005, in the Korean Intellectual Property Office, the disclosure of which is incorporated herein in its entirety by reference.

BACKGROUND OF THE INVENTION

1. Field of the Invention

The present invention relates to an organometallic complex and an organic electroluminescent device using the same, and more particularly, to an organometallic complex that can emit light ranging from a blue region to a red region through triplet metal-to-ligand charge-transfer (MLCT) and an organic electroluminescent device using the organometallic complex as an organic layer forming material.

2. Description of the Related Art

Organic electroluminescent (EL) devices, which are active-emissive type display devices, emit light by a recombination of electrons and holes at a fluorescent or phosphorescent organic layer receiving a current. Organic EL devices are lightweight, have wide viewing angles, produce high-quality images, and can be manufactured by simplified processes. In addition, by using organic EL devices, moving images with high color purity can be formed with low consumption power and low voltage. Accordingly, organic EL devices are suitable for portable electric applications.

In general, an organic EL device includes an anode, a hole transport layer, an emission layer, an electron transport layer, and a cathode stacked sequentially on a substrate. The hole transport layer, the emission layer, and the electron transport layer are organic layers. The organic EL device may operate thorough the following mechanism. First, a voltage is provided between the anode and the cathode. Holes injected from the anode move to the emission layer through the hole transport layer, and electrons injected from the cathode move to the emission layer through the electron transport layer. In the emission layer, the holes and electrons are recombined, thus producing excitons. The excitons decay radiatively, thus emitting light corresponding to the band gap of a material.

Materials for forming an emission layer are divided into fluorescent materials using singlet-state excitons and phosphorescent materials using triplet-state excitons, according to an emission mechanism. The fluorescent material or phosphorescent material may form the emission layer, or the fluorescent material or phosphorescent material-doped host material may form the emission layer. When electrons are excited, singlet excitons and triplet excitons are generated in a statistics ratio of 1:3 (see Baldo, et al., Phys. Rev. B, 1999, 60, 14422).

When the emission layer is composed of a fluorescent material, triplet excitons that are generated in the host cannot be used. On the other hand, when the emission layer is composed of a phosphorescent material, both singlet excitons and triplet excitons can be used, and thus, the inner quantum efficiency of 100% can be obtained (see Baldo et al., Nature, Vol. 395, 151-154, 1998). Accordingly, the use of the phosphorescent material results in better luminance efficiency than the fluorescent material.

When an organic molecule contains a heavy metal, such as Ir, Pt, Rh, and Pd, spin-orbital coupling occurs due to a heavy atom effect, and thus, singlet states and triplet states are mixed. Thus, a forbidden transition occurs and phosphorescent light is effectively emitted even at room temperature.

Recently, highly effective green and red emission materials that use phosphorescence having the inner quantum efficiency of 100% have been developed.

For example, transition metal compounds that include a transition metal, such as Ir or Pt, have been developed. However, materials that are suitable for highly effective full-color display and low-consumption power fluorescent application are green and red emission materials only. In other words, blue phosphorescent emission materials have not been developed. Accordingly, a phosphorescent full-color device cannot be manufactured.

In order to resolve this problem, blue emissive materials (disclosed in WO 02/15645 A1 and US 2002/0064681 A1); organometallic complexes that contains a bulky functional group that can deform the molecular geometry to widen the gap between a highest occupied molecular orbital (HOMO) and a lowest unoccupied molecular orbital (LUMO) or a functional group with a high ligand field, such as a cyano group (disclosed in Mat. Res. Soc. Symp. Proc. 708, 119, 2002; and 3rd Chitose International Forum on Photonics Science and Technology, Chitose, Japan, 6-8 Oct. 2002.); an Ir complex, such as $Ir(ppy)_2P(ph)_3Y$ where Y=Cl or CN (disclosed in US 2002/0182441 A1); and an Ir (III) complex containing a cyclometalating ligand and chelating diphosphine, Cl, and a cyano group (disclosed in US 2002/0048689 A1) have been developed.

SUMMARY OF THE INVENTION

The present invention provides an organometallic complex that can effectively emit green and red lights through a triplet metal-to-ligand charge-transfer (MLCT).

The present invention also provides an organic electroluminescent device that is manufactured using the organometallic complex to effectively emit green and red lights.

According to an aspect of the present invention, there is provided an organometallic complex represented by Formula 1:

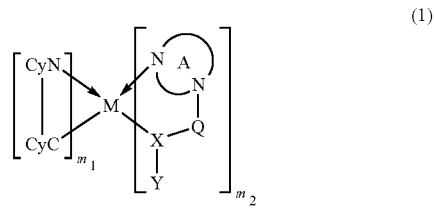

(1)

where M is Ir, Os, Pt, Pb, Re, Ru, or Pd;

CyN is a substituted or non-substituted C3-C60 heterocyclic group that contains N that can be bonded to M, or a substituted or non-substituted C3-C60 heteroaryl group that contains N that can be bonded to M;

CyC is a substituted or non-substituted C4-C60 carbocyclic group that contains C that can be bonded to M, a substituted or non-substituted C3-C60 heterocyclic group that contains C that can be bonded to M, a substituted or non-substituted C3-C60 aryl group that contains C that can be bonded to M, or a substituted or non-substituted C3-C60 heteroaryl group that contains C that can be bonded to M;

CyN-CyC is a cyclometalating ligand that is bonded to M through N and C, wherein substituents of CyN-CyC are each independently a halogen atom, —OR, —N(R)(R'), —P(R)(R'), —POR, —PO$_2$R, —PO$_3$R, —SR, —Si(R)(R')(R"), —B(R)(R'), —B(OR)(OR'), —C(O)R, —C(O)OR, —C(O)N(R), —CN, —NO$_2$, —SO$_2$, —SOR, —SO$_2$R, —SO$_3$R, a substituted or non-substituted C1-C20 alkyl group, or a substituted or non-substituted C6-C20 aryl group where R, R', and R" are each independently hydrogen, a substituted or non-substituted C1-C20 alkyl group, a substituted or non-substituted C1-C10 alkoxy group, a substituted or non-substituted C2-C20 alkenyl group, a substituted or non-substituted C2-C20 alkynyl group, a substituted or non-substituted C1-C20 heteroalkyl group, a substituted or non-substituted C6-C40 aryl group, a substituted or non-substituted C7-C40 arylalkyl group, a substituted or non-substituted C7-C40 alkylaryl group, a substituted or non-substituted C2-C40 heteroaryl group, or a substituted or non-substituted C3-C40 heteroarylalkyl group, and CyN and CyC are connected to form a substituted or non-substituted 4-7 atom cyclic group or a substituted or non-substituted 4-7 atom heterocyclic group;

$m_1$ is an integer from 0 to 2, and $m_2$ is 3-$m_1$;

A is a ligand which contains at least two nitrogen atoms and is bonded to M through one of the nitrogen atoms;

X is N, O, S, or P;

Y is selected from the above groups listed for R; and

Q is one of a substituted or non-substituted C1-C20 alkylene group, NR, and O where R is already described above.

According to another aspect of the present invention, there is provided an organic electroluminescent device including an organic layer interposed between a pair of electrodes, the organic layer composed of the organometallic complex.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
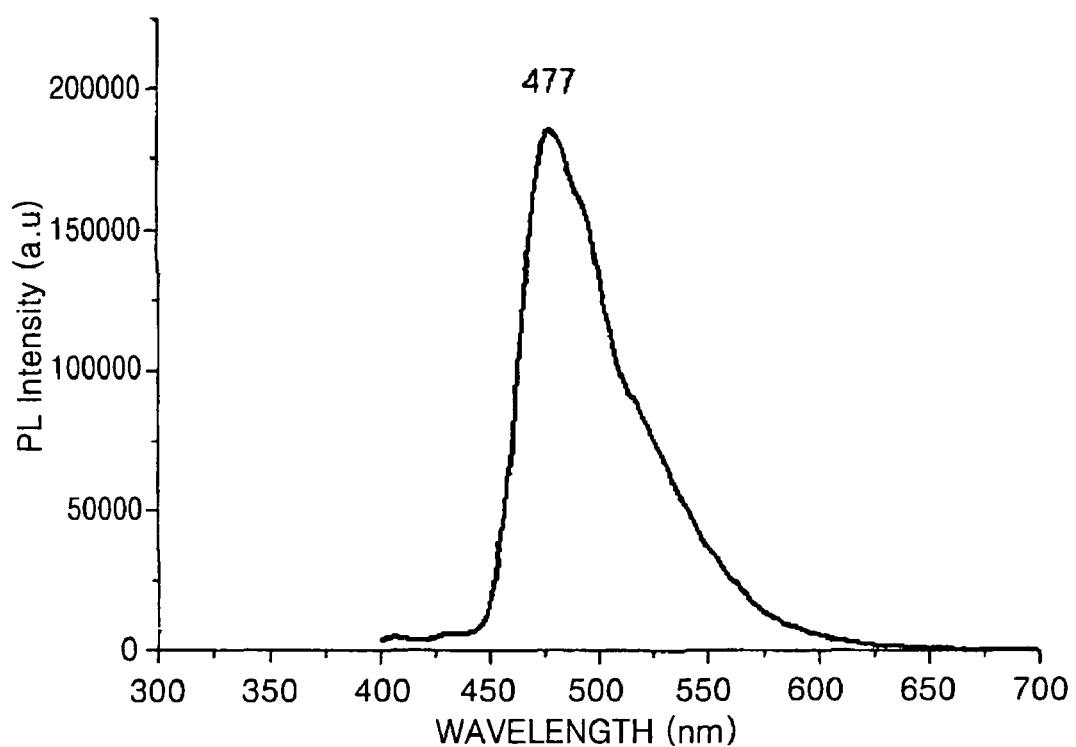
FIG. 1 is a photoluminescence (PL) spectrum of a compound represented by Formula 5.
Figure 2:
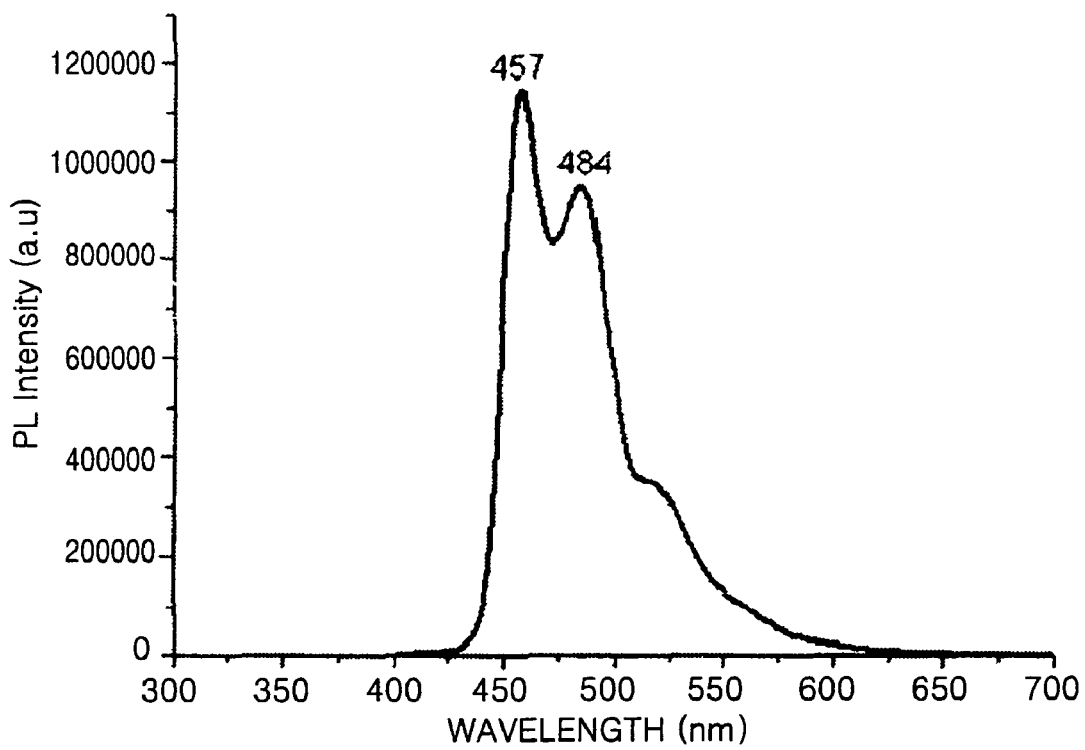
FIG. 2 is a PL spectrum of compound represented by Formula 6.
Figure 3:
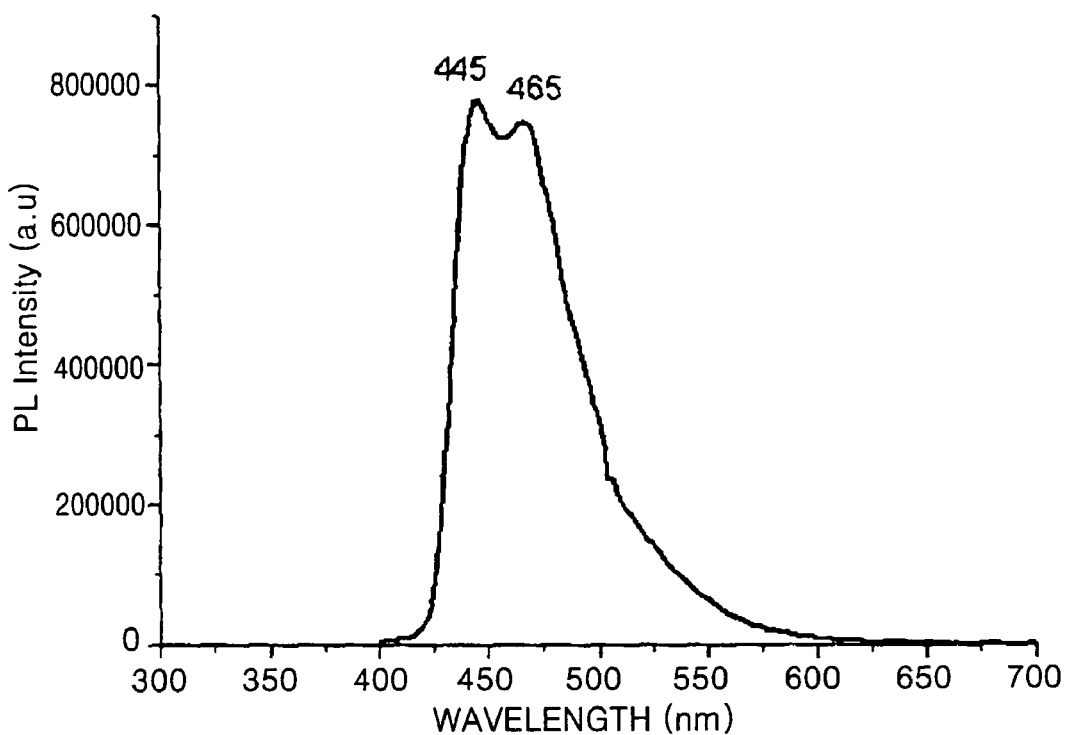
FIG. 3 is a PL spectrum of compound represented by Formula 7.
Figure 4:
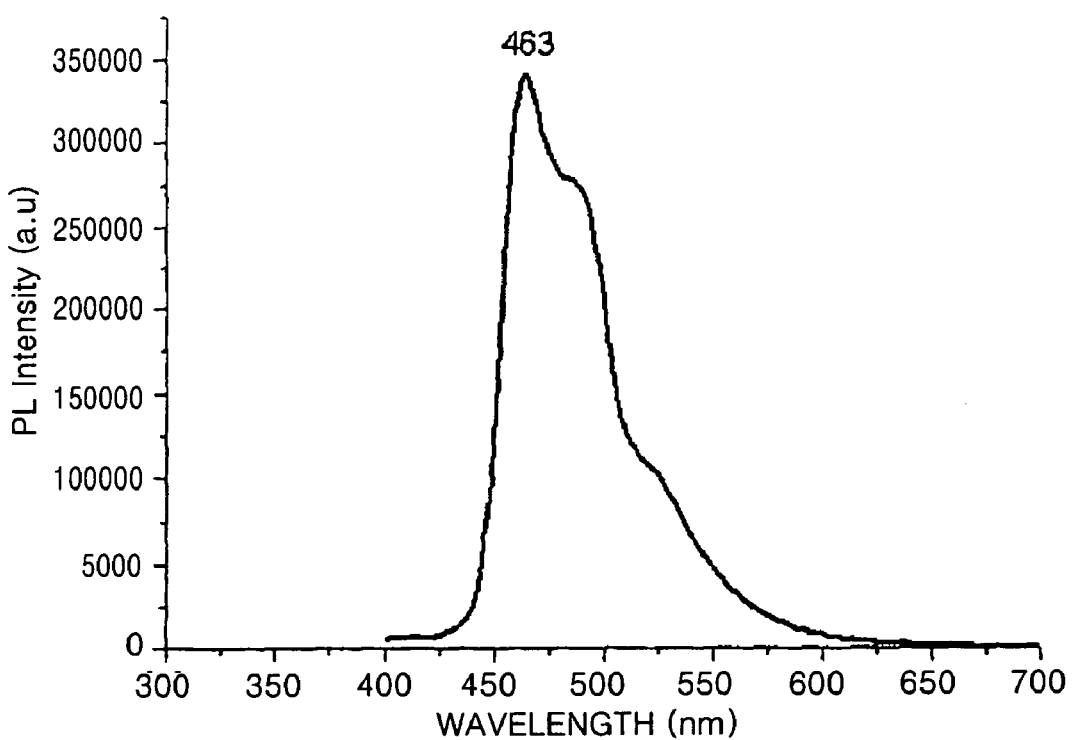
FIG. 4 is a PL spectrum of compound represented by Formula 8.

An organometallic complex represented by Formula 1 according to an embodiment of the present invention can emit blue light because the energy gap between highest occupied molecular orbital (HOMO) and triplet metal-to-ligand charge-transfer (MLCT) is widened. The increase of the energy gap is due to a bulky ligand that is coordinated to constrain the geometry of a molecule and has excellent σ-doner and π-doner able to provide a strong ligand field.

The organometallic complex is represented by Formula 1:

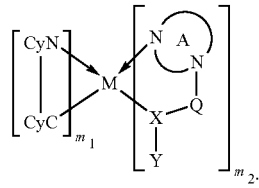

(1)

where M is Ir, Os, Pt, Pb, Re, Ru, or Pd;

CyN is a substituted or non-substituted C3-C60 heterocyclic group that contains N that can be bonded to M, or a substituted or non-substituted C3-C60 heteroaryl group that contains N that can be bonded to M;

CyC is a substituted or non-substituted C4-C60 carbocyclic group that contains C that can be bonded to M, a substituted or non-substituted C3-C60 heterocyclic group that contains C that can be bonded to M, a substituted or non-substituted C3-C60 aryl group that contains C that can be bonded to M, or a substituted or non-substituted C3-C60 heteroaryl group that contains C that can be bonded to M;

CyN-CyC is a cyclometalating ligand that is bonded to M through N and C, wherein substituents of CyN-CyC are each independently a halogen atom, —OR, —N(R)(R'), —P(R)(R'), —POR, —PO$_2$R, —PO$_3$R, —SR, —Si(R)(R')(R"), —B(R)(R'), —B(OR)(OR'), —C(O)R, —C(O)OR, —C(O)N(R), —CN, —NO$_2$, —SO$_2$, —SOR, —SO$_2$R, —SO$_3$R, a substituted or non-substituted C1-C20 alkyl group, or a substituted or non-substituted C6-C20 aryl group where R, R', and R" are each independently hydrogen, a substituted or non-substituted C1-C20 alkyl group, a substituted or non-substituted C1-C10 alkoxy group, a substituted or non-substituted C2-C20 alkenyl group, a substituted or non-substituted C2-C20 alkynyl group, a substituted or non-substituted C1-C20 heteroalkyl group, a substituted or non-substituted C6-C40 aryl group, a substituted or non-substituted C7-C40 arylalkyl group, a substituted or non-substituted C7-C40 alkylaryl group, a substituted or non-substituted C2-C40 heteroaryl group, or a substituted or non-substituted C3-C40 heteroarylalkyl group, and CyN and CyC are connected to form a substituted or non-substituted 4-7 atom cyclic group or a substituted or non-substituted 4-7 atom heterocyclic group with M;

$m_1$ is an integer from 0 to 2, and $m_2$ is 3-$m_1$;

A is a ligand which contains at least two nitrogen atoms and is bonded to M through one of the nitrogen atoms;

X is N, O, S, or P;

Y is selected from the groups listed for R; and

O is one of a substituted or non-substituted C1-C20 alkylene group, NR, and O where R is already described above.

The heterocyclic group and the heteroaryl group of Formula 1 are a cyclic group and an aryl group that each contain a hetero atom, such as, N, O, and S.

M of Formula 1 is Ir, Os, Pt, Pb, Re, Ru, or Pd, preferably, Ir or Pt.

CyN of Formula 1 is a substituted or non-substituted C3-C60 heterocyclic group that contains N that can be bonded to M, or a substituted or non-substituted C3-C60 heteroaryl group that contains N that can be bonded to M. Examples of the substituted or non-substituted C3-C60 heterocyclic group that contains N that can be bonded to M include pyrrolidine, morpholine, thiomorpholine, thiazolidine, and the like. Examples of the substituted or non-substituted C3-C60 heteroaryl group that contains N that can be bonded to M include pyridine, 4-methoxy pyridine, quinoline, pyrrol, indole, pyrazine, pyrazole, imidazole, pyrimidine, quinazoline, thiazole, oxazole, triazine, 1,2,4-triazole, and the like.

CyC of Formula 1 is a substituted or non-substituted C4-C60 carbocyclic group that contains C that can be bonded to M, a substituted or non-substituted C3-C60 heterocyclic group that contains C that can be bonded to M, a substituted or non-substituted C3-C60 aryl group that contains C that can be bonded to M, or a substituted or non-substituted C3-C60 heteroaryl group that contains C that can be bonded to M. Examples of the substituted or non-substituted C4-C60 carbocyclic group that contains C that can be bonded to M include cyclohexane, cyclopentane, and the like. Examples of the substituted or non-substituted C3-C60 heterocyclic group that contains C that can be bonded to M include tetrahydrofurane, 1,3-dioxane, 1,3-dithiane, 1,3-dithiolane, 1,4-dioxa-8-azaspiro[4,5]decane, 1,4-dioxaspiro[4,5]decan-2-one, and the like. Examples of the substituted or non-substituted C3-C60 aryl group that contains C that can be bonded to M include phenyl, 1,3-benzodioxole, biphenyl, naphthalene, anthracene, azulene, and the like. Examples of the substituted or non-substituted C3-C60 heteroaryl group that contains C that can be bonded to M include thiophene, furan2(5H)-furanone, pyridine, coumarin, imidazole, 2-phenylpyridine, 2-benzothiozole, 2-benzoxazole, 1-phenylpyrazole, 1-naphthylpyrazole, 5-(4-methoxyphenyl)pyrazole, 2,5-bisphenyl-1,3,4-oxadiazole, 2,3-benzofuran2-(4-biphenyl)-6-phenyl benzoxazole, and the like.

In Formula 1, CyN and CyC are connected to form a substituted or non-substituted 4-7 atom cyclic group or a substituted or non-substituted 4-7 atom heterocyclic group, in particular, a condensed 4-7 atom cyclic or heterocyclic group with M. The cyclic group or heterocyclic group may be a C4-C30 cycloalkyl group, a C3-C30 heterocycloalkyl group, a C6-C30 aryl group, or a C4-C30 hetero allyl group. The cyclic group or heterocyclic group can be substituted with at least one substituent. The term 'hetero' indicates a case where a hetero atom, such as N, O, P, S, or the like is included.

The substituent of CyN-CyC may be preferably a halogen atom, —OR, —N(R)$_2$, —P(R)$_2$, —POR, —PO$_2$R, —PO$_3$R, —SR, —Si(R)$_3$, —B(R)$_2$, —B(OR)$_2$, —C(O)R, —C(O)OR, —C(O)N(R), —CN, —NO$_2$, —SO$_2$, —SOR, —SO$_2$R, or —SO$_3$R, (i.e., where R, R' and R" are the same).

X is N, O, S, or P.

Y is selected from the groups listed for R, preferably, hydrogen or a substituted or non-substituted C1-C20 alkyl group.

Q is one of a substituted or non-substituted C1-C20 alkylene group, NR, and O, and R is independently selected from the above listed groups for the above R.

Q may be O, NH, or a C2-C4 alkylene group.

$m_1$ is an integer from 0 to 2, preferably, 1 or 2. $m_2$ is 3-$m_1$, preferably, $m_2$ is 1 or 2.

A is a ligand that contains at least two nitrogen atoms and binds to M through one of at least two nitrogen atoms. A may be, but is not limited to, a derivative of a compound selected from indazole, imidazole, imidazoline, imidazolyl, imidazole derivative, pyrazole, benzotriazole, benzothaidiazole, oxadiazole, thaiadiazole, pyrazoline, pyrazolidine, benzimidazole, and triazine which are substituted or non-substituted.

For example, A is a compound selected from imidazole, pyrazole, and derivatives of these.

The cyclometalating ligand (CyN-CyC) may be represented by, but is not limited to, one of the following Formulae 1-(i) to 1-(xxiii):

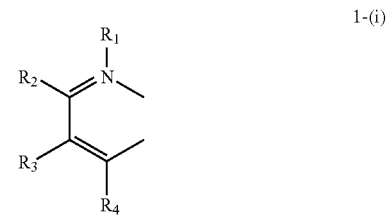

1-(i)

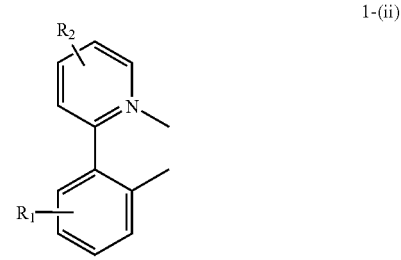

1-(ii)

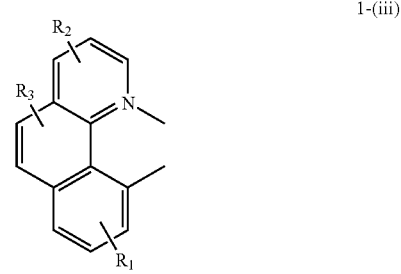

1-(iii)

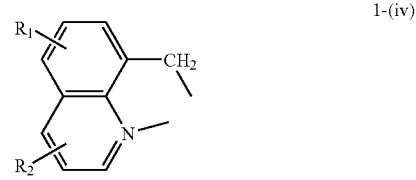

1-(iv)

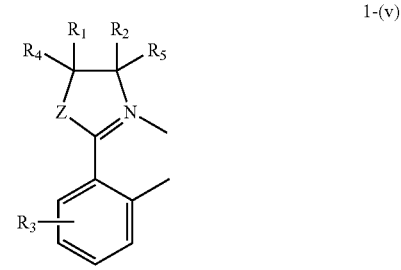

1-(v)

-continued
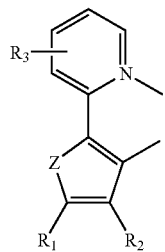
1-(vi)
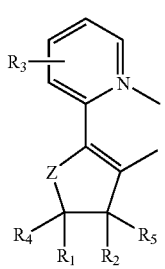
1-(vii)
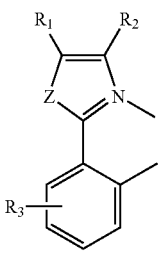
1-(viii)
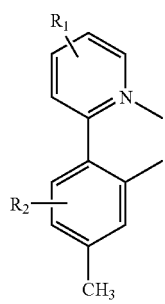
1-(ix)
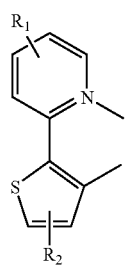
1-(x)
-continued
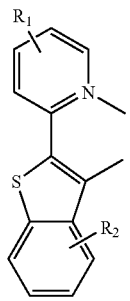
1-(xi)
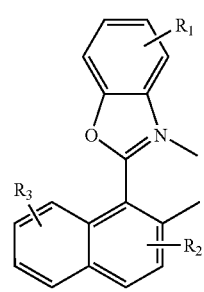
1-(xii)
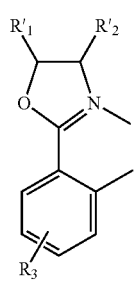
1-(xiii)
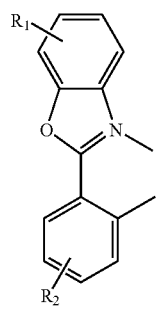
1-(xiv)
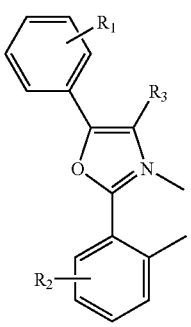
1-(xv)

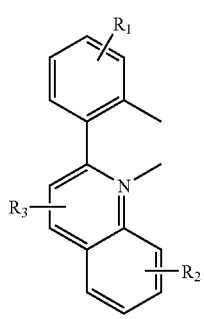
1-(xvi)
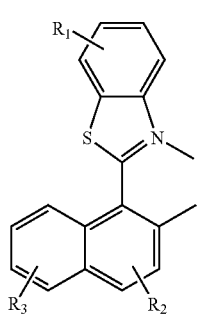
1-(xvii)
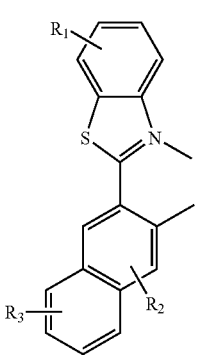
1-(xviii)
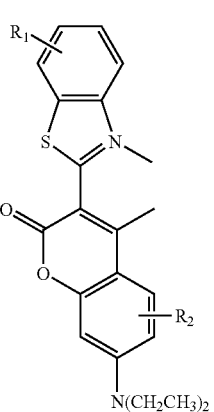
1-(xix)
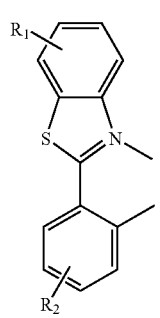
1-(xx)
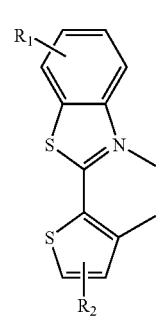
1-(xxi)
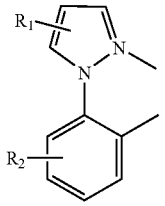
1-(xxii)
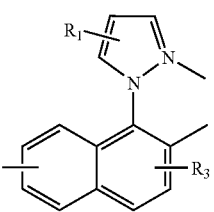
1-(xxiii)
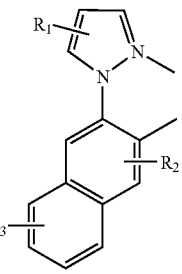
1(xxiv)
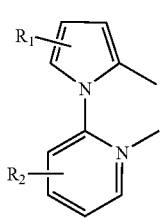
1-(xxv)

-continued 1-(xxvi)
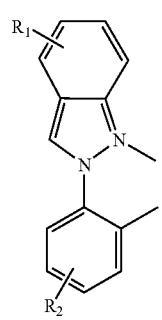

1-(xxvii)
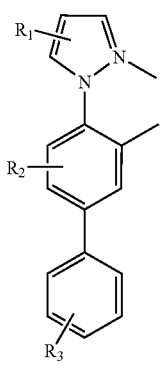

1-(xxviii)
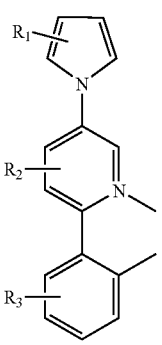

where $R_1$, $R_2$, $R_3$, $R_4$, and $R_5$ which are single-substituted or multi-substituted functional groups are each independently H, a halogen atom, —OR, —N(R)$_2$, —P(R)$_2$, —POR, —PO$_2$R, —PO$_3$R, —SR, —Si(R)$_3$, —B(R)$_2$, —B(OR)$_2$, —C(O)R, —C(O)OR, —C(O)N(R), —CN, —NO$_2$, —SO$_2$, —SOR, —SO$_2$R, —SO$_3$R, a C1-C20 alkyl group, or a C6-C20 aryl group, wherein R is independently selected from the above listed groups for the above R, and Z is S, O, or NR$_0$, where R0 is H or a C1-C20 alkyl group.

The organometallic complex represented by Formula 1 may be represented by, but is not limited to, one of the following Formulae 2 through 4:

(2)
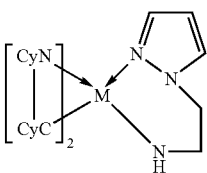

-continued (3)
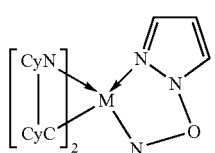

(4)
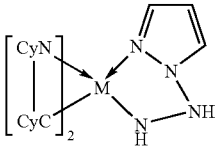

where M and CyN-CyC are already described, and preferably, M is Ir or Pt.

The organometallic complex represented by Formula 1 may be represented by one of the following Formulae 5 through 16:

(5)
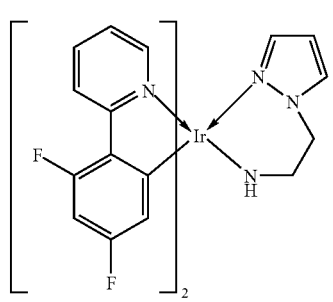

(6)
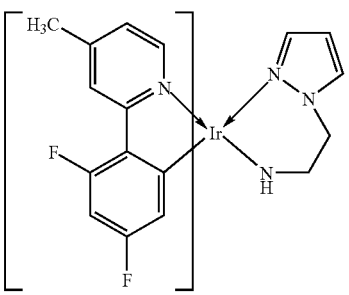

(7)
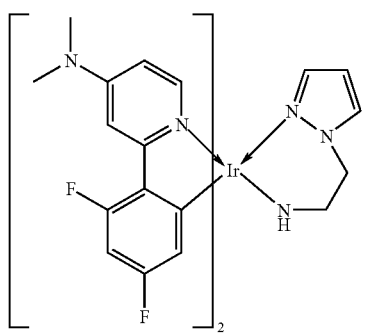

-continued (8)
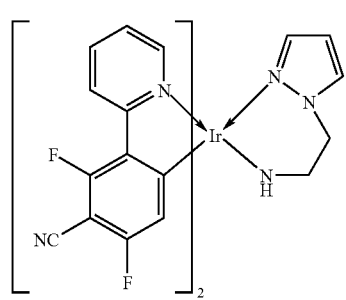

(9)
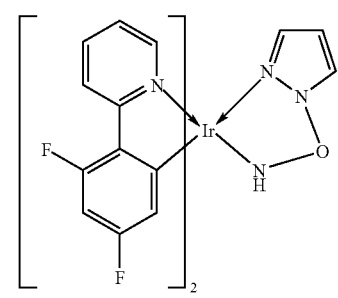

(10)
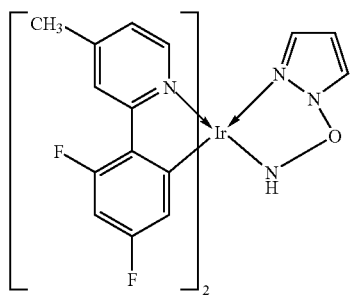

(11)
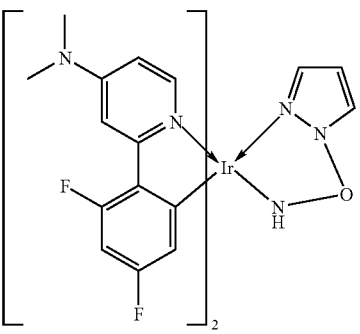

(12)
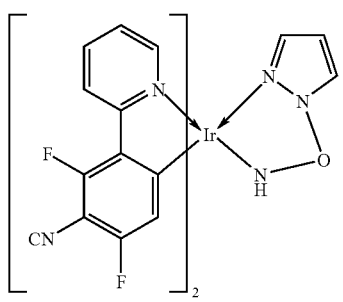

-continued

(13)
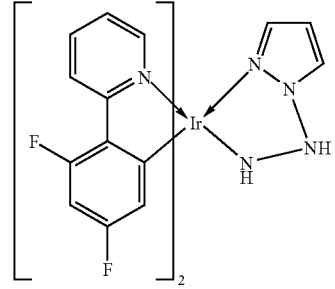

(14)
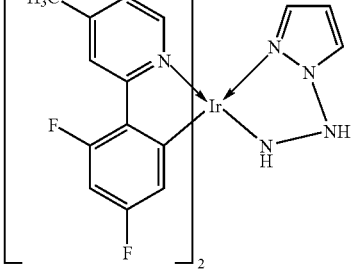

(15)
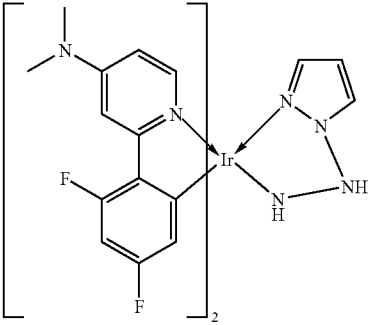

(16)
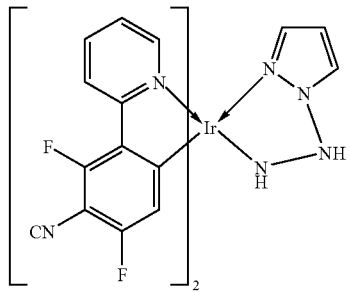

The compound represented by Formula 1 emits light of 400 nm to 650 nm.

The photoluminescence (PL) spectrums of compounds represented by Formulae 5, 6, 7 and 8 are shown in FIGS. 1, 2, 3 and 4, respectively.

The organometallic complex represented by Formula 1 can be synthesized using a $[Ir(C^\wedge N)_2Cl]_2$ derivative that is a starting material for the cyclometalating moiety in a method developed by Watts Group (see F. O. Garces, R. J. Watts, Inorg. Chem. 1988, (35), 2450).

An organic EL device includes an organic layer composed of the organometallic complex represented by Formula 1, in particular, an emission layer composed of the organometallic complex represented by Formula 1. The organometlalic complex represented by Formula 1 is suitable as a phosphorescent dopant material and exhibits excellent emission characteristics in a blue wavelength region.

When the organometallic complex represented by Formula 1 is used as the phosphorescent dopant, the organic layer may further include at least one host selected from at least one polymer host, a mixture host of a polymer and a low molecular weight molecule, a low molecular weight molecule host, and a non-emission polymer matrix. Any polymer host, any low molecular weight host, any non-emission polymer matrix which are commonly used to manufacture an emission layer of an organic EL device can be used in the present embodiment. The polymer host may be, but is not limited to, poly (vinylcarbazole) (PVK) or Polyfluorene. The low molecular weight host may be, but is not limited to, CBP(4,4'-N,N'-dicarbazole-biphenyl), 4,4'-bis[9-(3,6-biphenylcarbazolyl)]-1-1,1'-biphenyl{4,4'-bis[9-(3,6-biphenylcarbazolyl)]-1-1,1'-biphenyl}, 9,10-bis[(2',7'-t-butyl)-9',9'''-spirobifluorenyl anthracene, or tetrafluorene. The non-emission polymer matrix may be, but is not limited to, polymethylmethacrylate, or polystyrene.

The amount of the organometallic complex represented by Formula 1 may be in the range of 1 to 30 parts by weight based on 100 parts by weight of the total amount of an emission layer forming material. When the amount of the organometallic complex represented by Formula 1 is less than 1 part by weight, the emission material is insufficient, and thus, efficiency and lifetime of the organic EL device decrease. When the amount of the organometallic complex represented by Formula 1 is greater than 30 parts by weight, triplet stats are quenched, and thus, the efficiency of the organic EL device decreases. The organometallic complex may be used to form an emission layer by vacuum deposition, sputtering, printing, coating, ink-jet printing, or other methods.

The organometallic complex represented by Formula 1 can be used with a green emission material or a red emission material to emit a white light.

FIGS. 5A through 5F are sectional views of organic electroluminescent devices according to embodiments of the present invention.

Figure 5A:
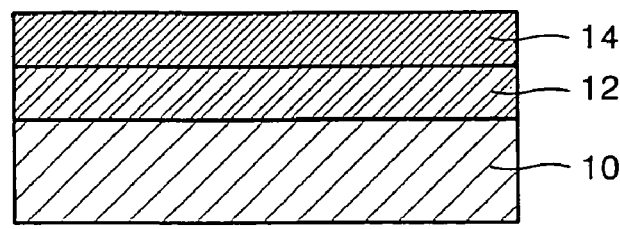
FIGS. 5A through 5F are sectional views of organic electroluminescent devices according to embodiments of the present invention.

Referring to FIG. 5A, an emission layer 12 composed of the biphenyl derivative represented by Formula 1 and a second electrode 14 are sequentially deposited on a first electrode 10.

Figure 5B:
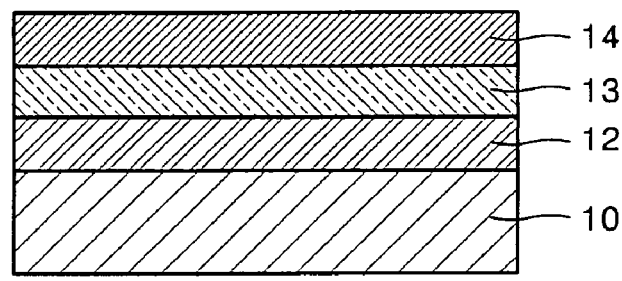

Referring to FIG. 5B, the emission layer 12 composed of the biphenyl derivative represented by Formula 1, a hole blocking layer (HBL) 13, and a second electrode 14 are sequentially deposited on the first electrode 10.

Figure 5C:
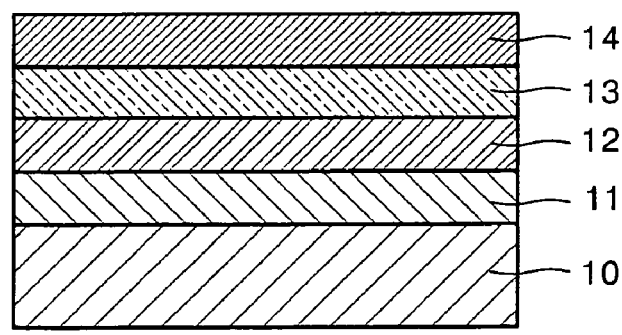

Referring to FIG. 5C, a hole injection layer (HIL) 11 is interposed between the first electrode 10 and the emission layer 12.

Figure 5D:
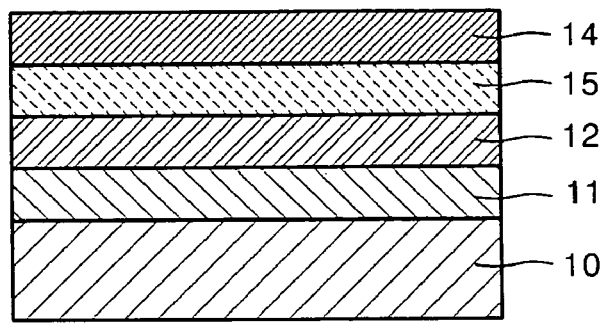

Referring to FIG. 5D, the organic EL device of FIG. 5D has the same structure as the organic EL device of FIG. 5C, except that the HBL 13 is replaced with an electron transport layer (ETL) 15 on the emission layer 12.

Figure 5E:
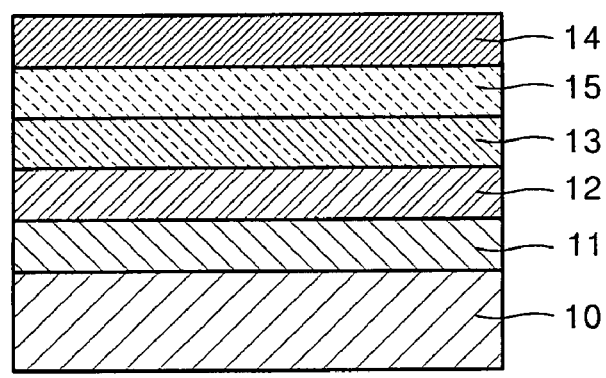

Referring to FIG. 5E, the organic EL device of FIG. 5E has the same structure as the organic EL device of FIG. 5C, except that the HBL 13 is replaced with the HBL 13 and an ETL 15 which are sequentially stacked. In some cases, an electron injection layer may be further interposed between the ETL 15 and the second electrode 14.

Figure 5F:
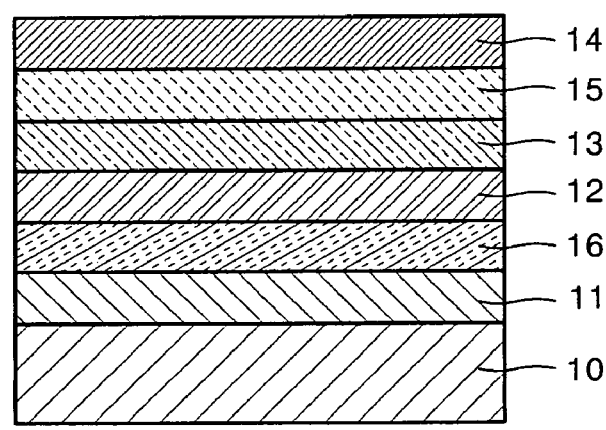

Referring to FIG. 5F, the organic EL device of FIG. 5F has the same structure as the organic EL device of FIG. 5E, except that a hole transport layer (HTL) 16 is interposed between the hole injection layer 11 and the emission layer 12. The hole transport layer 16 prevents the permeation of impurities into the emission layer 12 through the HIL 11.

These organic EL devices can be manufactured using conventional methods.

The thickness of the organic layer may be in the range of 30 to 100 nm. When the thickness of the organic layer is less than 30 nm, the efficiency and lifetime of the organic EL device are decreased. When the thickness of the organic layer is greater than 100 nm, the driving voltage increases. In this case, the term 'the organic layer' indicates a layer composed of an organic material interposed between a pair of electrodes of an organic EL device. For example, the organic layer can be the emission layer, the ETL, the HTL, or the like.

The organic EL device may have a structure such as anode/emission layer/cathode, anode/buffer layer/emission layer/cathode, anode/hole transport layer/emission layer/cathode, anode/buffer layer/hole transport layer/emission layer/cathode, anode/buffer layer/hole transport layer/emission layer/electron transport layer/cathode, anode/buffer layer/hole transport layer/emission layer/hole blocking layer/cathode, or the like. However, the structure of the organic EL device is not limited thereto.

The buffer layer may be composed of a commonly used material. For example, a material for forming the buffer layer may be, but is not limited to, copper phthalocyanine, polythiophene, polyaniline, polyacetylene, polypyrrole, polyphenylene vinylene, or derivatives of these.

A material for forming the HTL may be a commonly used material. For example, the material for forming the hole transport layer may be, but is not limited to, polytriphenylamine.

A material for forming the ETL may be a commonly used material. For example, the material for forming the ETL may be, but is not limited to, polyoxadiazole.

A material for forming the HBL may be a commonly used material. For example, the material for forming the HBL may be, but is not limited to, LiF, $BaF_2$, or $MgF_2$.

The organic EL device according to an embodiment of the present invention can be manufactured using conventional emission materials and conventional methods An Ir complex may emit light of 400 nm to 650 nm. An emission diode using such organometallic complex can be used in light source illumination for full-color display, backlight, outdoor screens, optical communication, and interior decoration.

The present invention will be described in further detail with reference to the following examples. These examples are for illustrative purposes only and are not intended to limit the scope of the present invention.

Reference Example 1

Synthesis of $F_2$ppyIr Dimer

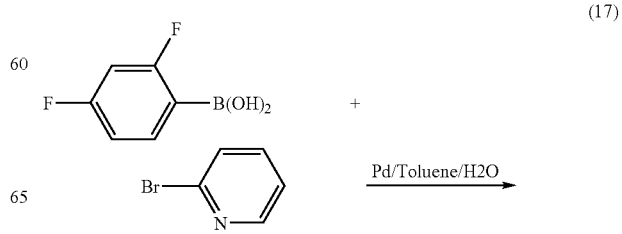

(17)

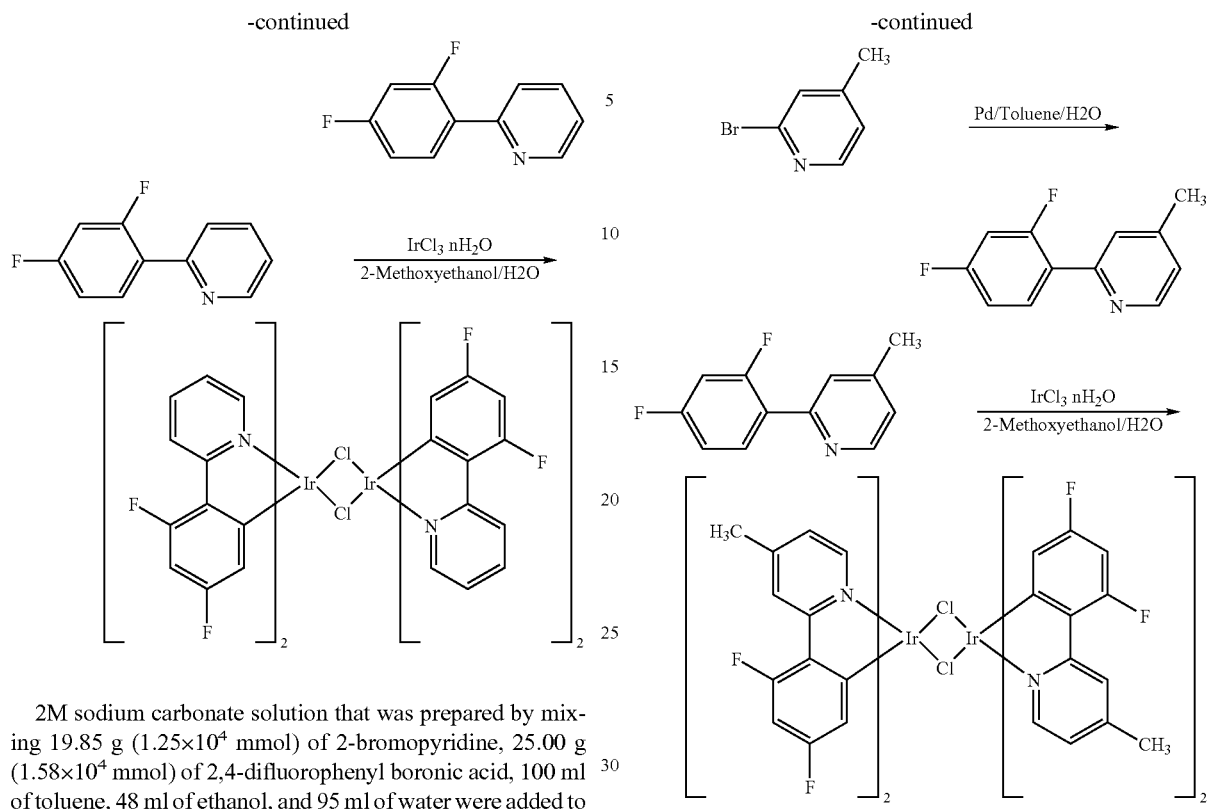

2M sodium carbonate solution that was prepared by mixing 19.85 g ($1.25 \times 10^4$ mmol) of 2-bromopyridine, 25.00 g ($1.58 \times 10^4$ mmol) of 2,4-difluorophenyl boronic acid, 100 ml of toluene, 48 ml of ethanol, and 95 ml of water were added to a 500 ml flask with side arms and stirred in a nitrogen atmosphere at room temperature. Subsequently, 4.53 g (3.92 mmol) of tetrakis(triphenylphosphine)paladium(0) was added to the reaction mixture and refluxed in the nitrogen atmosphere excluding light for 15 hours.

After the reaction was completed, the resulting reaction mixture was controlled to room temperature and extracted using ethylacetate and water. The extract was separated using column chromatography (toluene:hexane=10:1), thus obtaining a light brown liquid ($F_2$ppyH).

$^1$H-NMR(CD$_2$Cl$_2$, ppm): 8.69 [d, 1H], 8.03 [m, 1H], 7.70 [m, 2H], 7.27 [m, 1H], 7.00 [m, 2H]

A yellow powder of $F_2$ppyIr dimer represented by Formula 17 was prepared using the 2-(4,6-difluorophenylpyridine) monomer and IrCl$_3$·nH$_2$O. In this case, the synthesis method used in this case is described in J. Am. Chem. Soc., 1984, 106, 6647-6653, which is incorporated herein by reference.

$^1$H-NMR(CD$_2$Cl$_2$, ppm): 9.1 [d, 4H], 8.3 [d, 4H], 7.9 [t, 4H], 6.9 [m, 4H], 6.5 [m, 4H], 5.3 [d, 4H]

Reference Example 2

Synthesis of MeF$_2$ppyIr Dimer (18)

A MeF$_2$ppyIr dimer represented by Formula 18 was synthesized in the same manner as in Reference Example 1, except that 21.50 g ($1.25 \times 10^4$ mmol) of 2-bromo-4-methylpyridine was used instead of 2-bromopyridine.

$^1$H-NMR(CD$_2$Cl$_2$, ppm): 8.9 [d, 4H], 8.1 [s, 4H], 6.6 [d, 4H], 6.3 [m, 4H], 5.3 [d, 4H], 2.6 [s, 12H]

Reference Example 3

Synthesis of DMAF$_2$ppyIr Dimer (19)

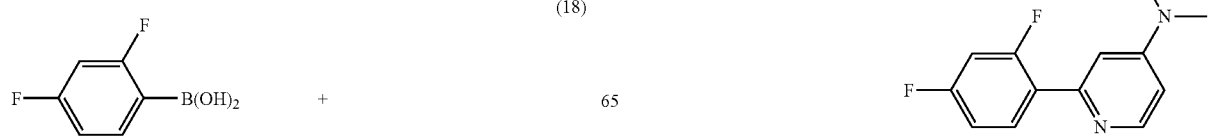

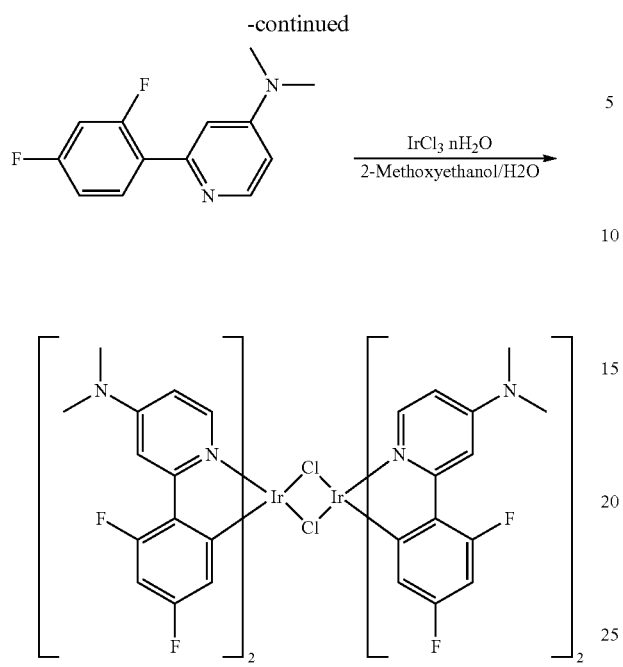

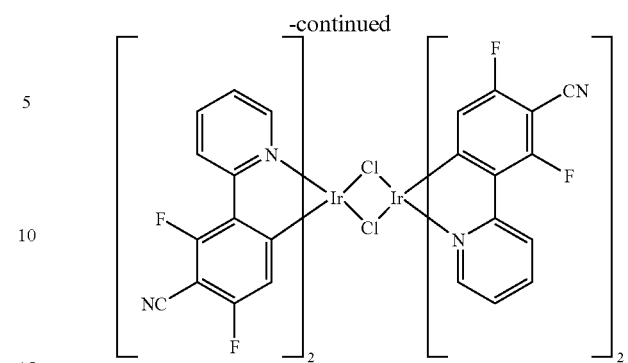

A DMAF$_2$ppyIr dimer represented by Formula 19 was synthesized in the same manner as in Reference Example 1, except that 25.26 g (1.25×10$^4$ mmol) of 2-bromo-4-dimethylaminopyridine was used instead of 2-bromopyridine.

$^1$H-NMR(CD$_2$Cl$_2$, ppm): 8.7 [d, 4H], 7.5 [t, 4H], 6.3 [m, 4H], 6.1 [m, 4H] 5.4 [d, 4H], 3.2 [s, 24H].

Reference Example 4

Synthesis of F$_2$CNppyIr

A F$_2$CNppyIr dimer represented by Formula 20 was synthesized in the same manner as in Reference Example 1, except that 22.86 g of 3-cyano-2,4-difluorophenylboronic acid was used instead of 2,4-difluorophenyl boronic acid.

$^1$H-NMR(CD$_2$Cl$_2$, ppm): 9.5 (d, 1H), 8.3 (m, 1H), 7.7 (m, 1H), 6.0 (d, 1H), 5.3 (d, 1H).

Example 1

Synthesis of Compound Represented by Formula 5

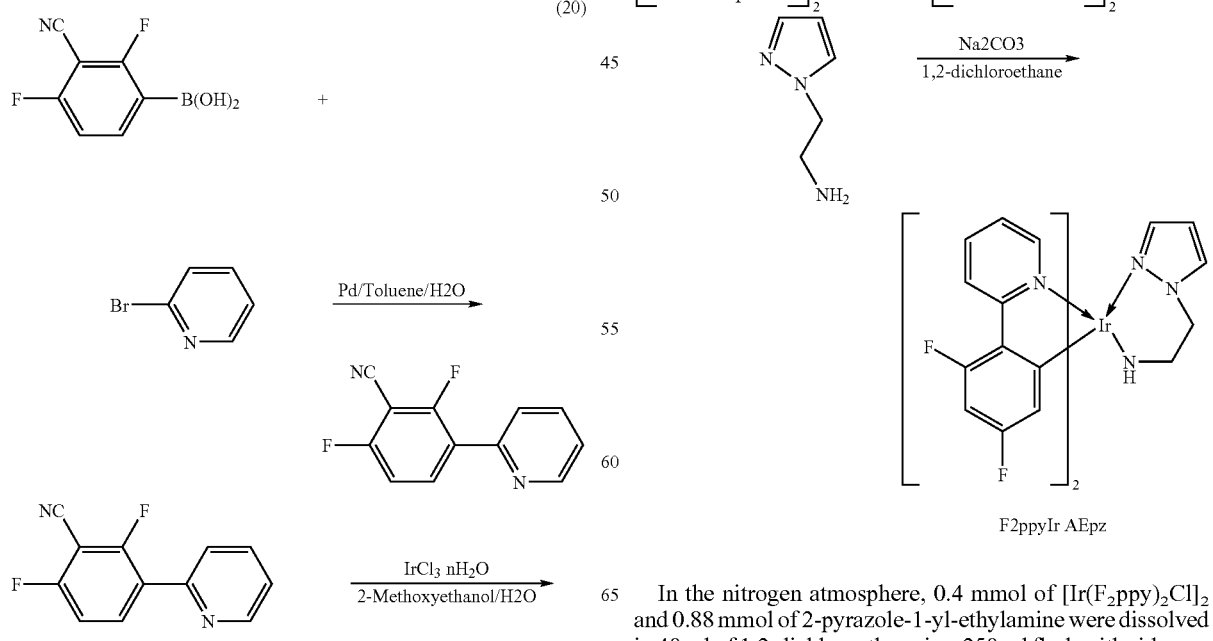

In the nitrogen atmosphere, 0.4 mmol of [Ir(F$_2$ppy)$_2$Cl]$_2$ and 0.88 mmol of 2-pyrazole-1-yl-ethylamine were dissolved in 40 ml of 1,2-dichloroethane in a 250 ml flask with side arm and reacted at room temperature for 2 to 10 hours. After the reaction was completed, the reaction solution was filtered using Celite and the filtrate was added to hexane, so that a yellow powder [Ir(F$_2$ppy)$_2$Cl]$_2$-[aminethylpyrazole] precipitated. In the reactor, 0.5 mmol of [Ir(F$_2$ppy)$_2$Cl]$_2$-[aminethylpyrazole] dissolved in 20 ml of 1,2-dicholoroethane and 2.0 mmol of a sodium carbonate dissolved in 15 ml methanol were added to the reactor and stirred at room temperature for 0.5 to 24 hours. After the reaction was completed, the reaction solution was filtered using Celite and the filtrate was added to hexane, so that a yellow power precipitated. The yellow power solid was refined using silicagel column (methylenecholide:acetone=10:1). The structure of the product was identified using $^1$H NMR spectrum:

$^1$H-NMR(CD$_2$Cl$_2$, ppm): 9.8 (d, 1H), 8.5 (d, 1H), 8.2 (t, 2H), 7.8 (m, 2H), 7.5 (m, 2H), 7.2 (m, 3H), 6.2 (d, 2H), 5.7 (d, 1H), 5.5 (d, 1H), 4.4 (m, 1H), 3.9 (m, 1H), 3.4 (m, 1H), 3.1 (m, 1H), 2.5 (m, 1H).

Example 2

Synthesis of Compound Represented by Formula 6

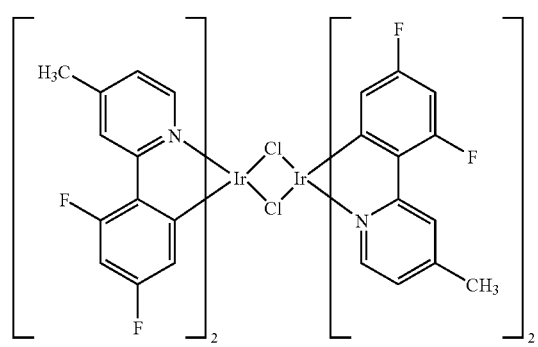

(6)

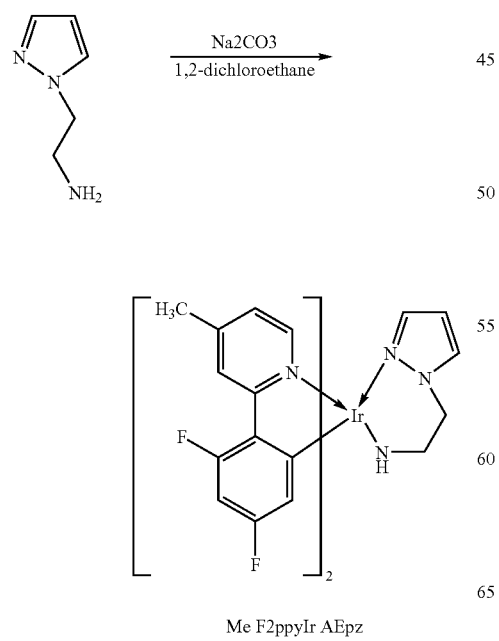

Me F2ppyIr AEpz

MeF$_2$ppyIr amineethyl pyrazole was synthesized in the same manner as in Example 1, except that MeF$_2$ppyIr dimer was used instead of F$_2$ppyIr dimer. The structure of the product was identified using $^1$H NMR spectrum:

$^1$H-NMR(CD$_2$Cl$_2$, ppm): 9.9 (d, 1H), 8.1 (t, 1H), 8.0 (t, 1H), 7.5 (m, 1H), 7.4 (d, 1H), 7.2 (m, 1H), 7.0 (m, 1H), 6.7 (m, 1H), 6.4 (m, 2H), 6.2 (t, 1H), 5.7 (m, 2H), 4.7 (m, 1H), 4.4 (m, 1H), 3.9 (m, 1H), 3.6 (m, 1H), 2.8 (m, 1H), 2.5 (m, 6H).

Example 3

Synthesis of Compound Represented by Formula 7

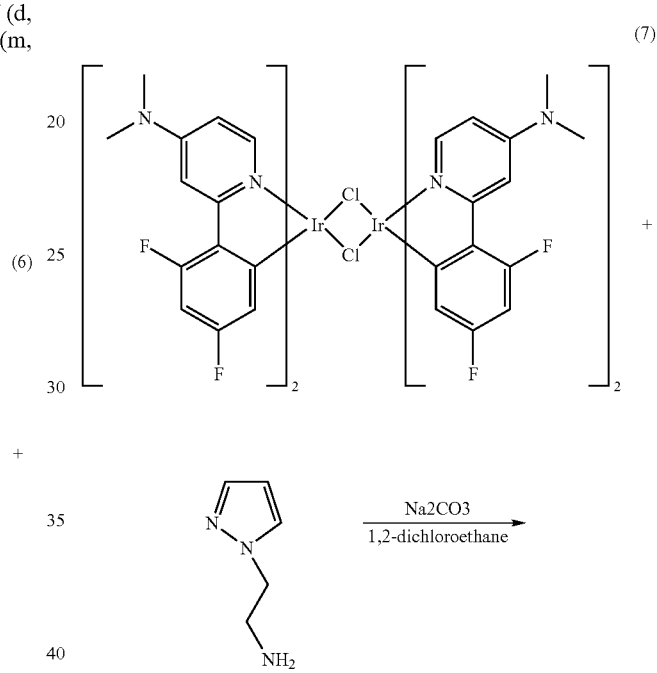

(7)

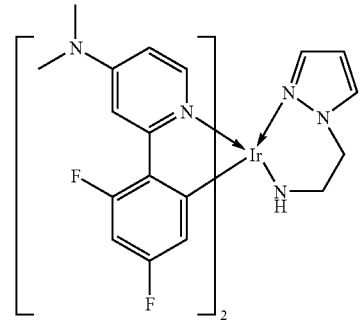

DMA F2ppyIr AEpz

DMAF$_2$ppyIr amineethyl pyrazole was synthesized in the same manner as in Example 1, except that DMAF$_2$ppyIr dimer was used instead of F$_2$ppyIr dimer. The structure of the product was identified using $^1$H NMR spectrum:

$^1$H-NMR(CD$_2$Cl$_2$, ppm): 9.6 (d, 1H), 7.5 (m, 2H), 7.5 (t, 1H), 7.1 (d, 1H), 6.8 (d, 1H), 6.6 (m, 1H), 6.3 (m, 3H), 6.2 (t, 1H), 5.8 (m, 2H), 4.7 (m, 1H), 4.5 (m, 1H), 3.7 (m, 1H), 3.1 (m, 12H), 3.1 (m, 1H), 2.3 (m, 1H).

Example 4

Synthesis of Compound Represented by Formula 8

(8)

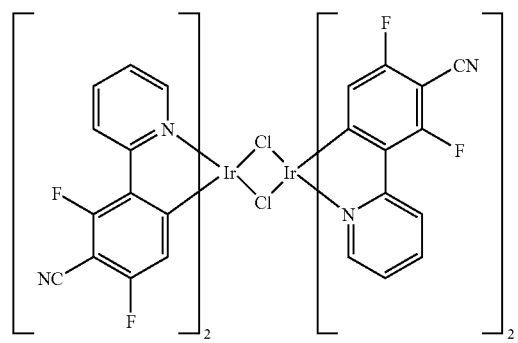

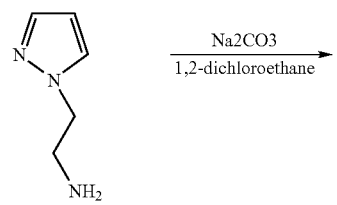

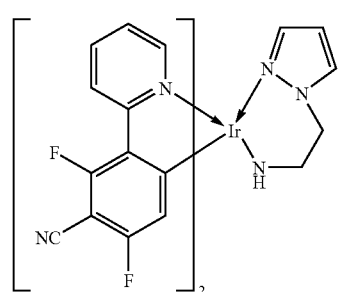

F2CN ppyIr AEpz

F$_2$CNppyIr amineethyl pyrazole was synthesized in the same manner as in Example 1, except that F$_2$CNppyIr dimer was used instead of F$_2$ppyIr dimer. The structure of the product was identified using $^1$H NMR spectrum:

$^1$H-NMR(CD$_2$Cl$_2$, ppm): 9.8 (d, 1H), 8.6 (d, 1H), 8.3 (m, 1H), 8.0 (m, 1H), 7.6 (m, 1H), 7.5 (m, 1H), 7.4 (m, 1H), 7.3 (m, 1H), 6.3 (m, 1H), 6.2 (m, 1H), 5.9 (d, 1H), 5.7 (d, 1H), 4.3 (m, 1H), 4.0 (m, 1H), 3.2 (m, 1H), 3.1 (m, 1H), 2.5 (m, 1H).

The products obtained according to Examples 1 through 4 were dissolved in methylenechloride to prepare 10$^{-4}$ M solutions, of which luminance characteristics were measured.

Luminance characteristics and color coordinates (CIE) of these products are shown in Table 1 and Table 2:

TABLE 1

| Structure | Property | | |
|---|---|---|---|
| | $\lambda_{max}$ nm | CIE cordinates | |
| | Sol'n | x | y |
| (structure) | 477 | 0.1501 | 0.3355 |
| (structure) | 457 | 0.1450 | 0.2075 |
| (structure) | 445 | 0.1465 | 0.1248 |
| (structure) | 463 | 0.1458 | 0.2335 |

Referring to Table 1, dopants containing pyrazole-amine exhibited excellent phosphorescent characteristics. In particular, the introduction of the substituent results in a strong electronic effect and thus the dopant is suitable as a blue phosphorescent material emitting light of 440 nm to 470 nm.

Manufacture of Organic EL Device

Example 5

An indium-tin oxide (ITO)-coated transparent electrode substrate 20 was washed, and the ITO was formed in a pattern using a photoresist resin and an etchant, thus forming an ITO electrode pattern 10. The ITO electrode pattern 10 was washed. PEDOT(poly(3,4-ethylenedioxythiophene))[AI 4083] was coated on the washed ITO electrode pattern to a thickness of about 50 nm and baked at 120° C. for about 5 minutes to form a hole injection layer 11.

An emission layer forming composition that was prepared by mixing 3.3 g of a polystyrene solution, which was prepared by dissolving 53.1 g of PS in 17.4 g of toluene; 29 mg of mCP; and 2.5 mg of MeF$_2$ppy amineethyl pyrazole (represented by Formula 6 and prepared in Example 2) was spin coated on the hole injection layer 11 and baked at 100° C. for 1 hour. The baked result was placed in a vacuum oven to remove the solvent completely, thus forming an emission layer 12 with a thickness of 40 nm [PS 24 wt %, mCP 70 wt %, MeF$_2$ppy 6 wt %].

Then, Balq (aluminum(III)bis(2-methyl-8-quinolinato)$_4$-phenylphenolate) was vacuum deposited on the polymer emission layer 12 using a vacuum depositing device at a pressure of $4 \times 10^{-6}$ torr or less, thus forming an electron transport layer 15 with a thickness of 40 nm. LiF was vacuum deposited on the electron transport layer 15 at a speed of 0.1/sec to form an electron injection layer with a thickness of 10 nm.

Al was deposited at a speed of 10 Å/sec to form a 200 nm-thick cathode 14, and encapsulated using a metal can in a glove box filled with BaO powder under a dry nitrogen gas atmosphere, thus completely manufacturing the organic EL device.

Figure 6:
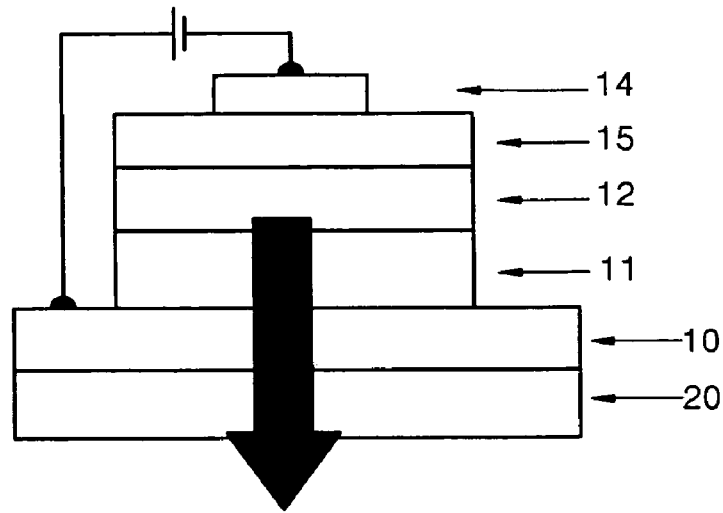
FIG. 6 is a schematic view of an organic electroluminescent device according to an embodiment of the present invention.

The EL device had a multi-layer structure and its schematic view is illustrated in FIG. 6. In this case, the emission area was 6 mm$^2$.

Example 6

An EL device was manufactured in the same manner as in Example 5, except that DMAF$_2$ppy amineethyl pyrazole (manufactured in Example 3 and represented by Formula 7) was used instead of MeF$_2$ppy amineethyl pyrazole (represented by Formula 9).

Example 7

An EL device was manufactured in the same manner as in Example 5, except that F$_2$CNppy amineethyl pyrazole (manufactured in Example 4 and represented by Formula 8) was used instead of MeF$_2$ppy amineethyl pyrazole (represented by Formula 6)

Comparative Example

An EL device was manufactured in the same manner as in Example 5, except that a material represented by the following Formula 21 was used instead of MeF$_2$ppy amineethyl pyrazole (represented by Formula 6):

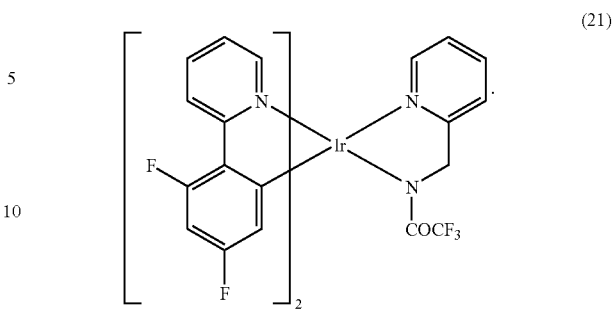

(21)

Electric luminance characteristics and color coordinates (CIE) characteristics of EL devices prepared in Comparative Example and Example 6 are shown in Table 2.

TABLE 2

| | Property | | |
|---|---|---|---|
| | $\lambda_{max}$nm | CIE cordinates | |
| Structure | EL | x | y |
| (structure 1) | 469 | 0.17 | 0.36 |
| (structure 2) | 470 | 0.17 | 0.26 |

Referring to Table 2, the color coordinate of an Y axis was better when A of Formula 1 that bonds to M contains at least two nitrogen atoms than when A that bonds to M contains a single nitrogen atom.

Figure 7:
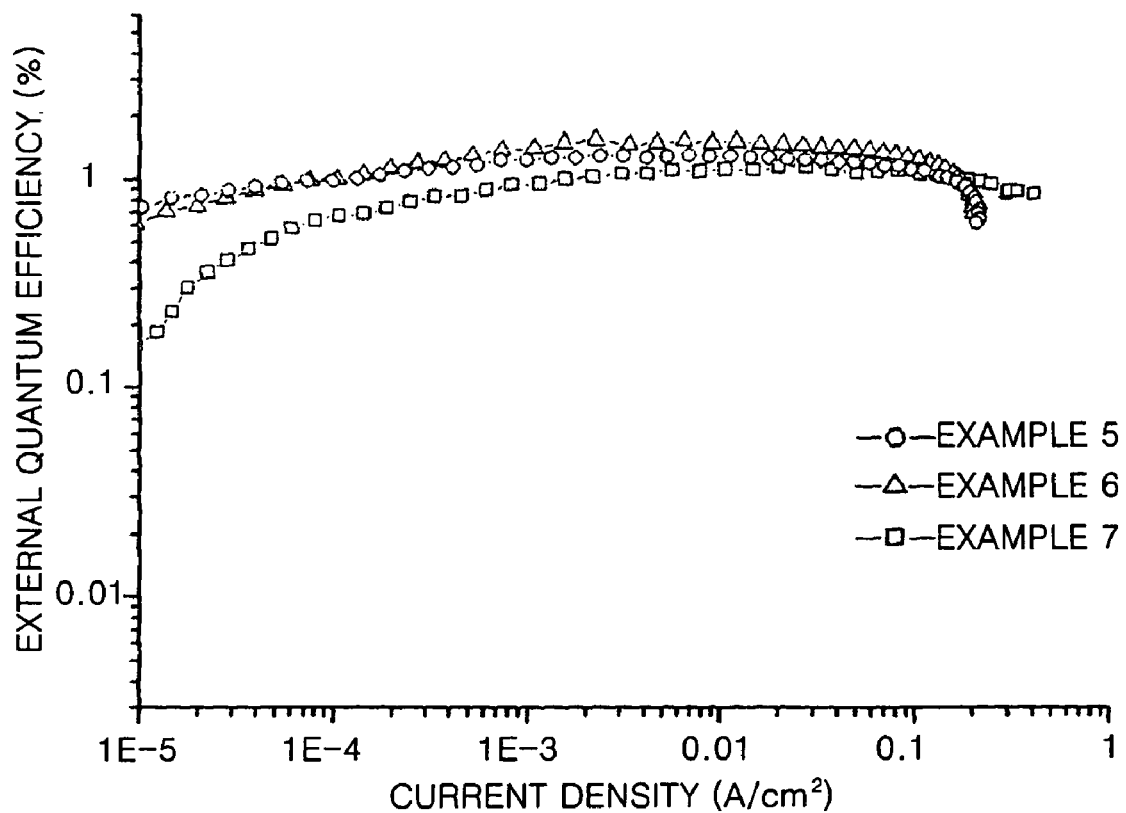
FIG. 7 is a graph of external quantum efficiency versus current density of the organic electroluminescent devices using compounds according to embodiments of the present invention.
Figure 8:
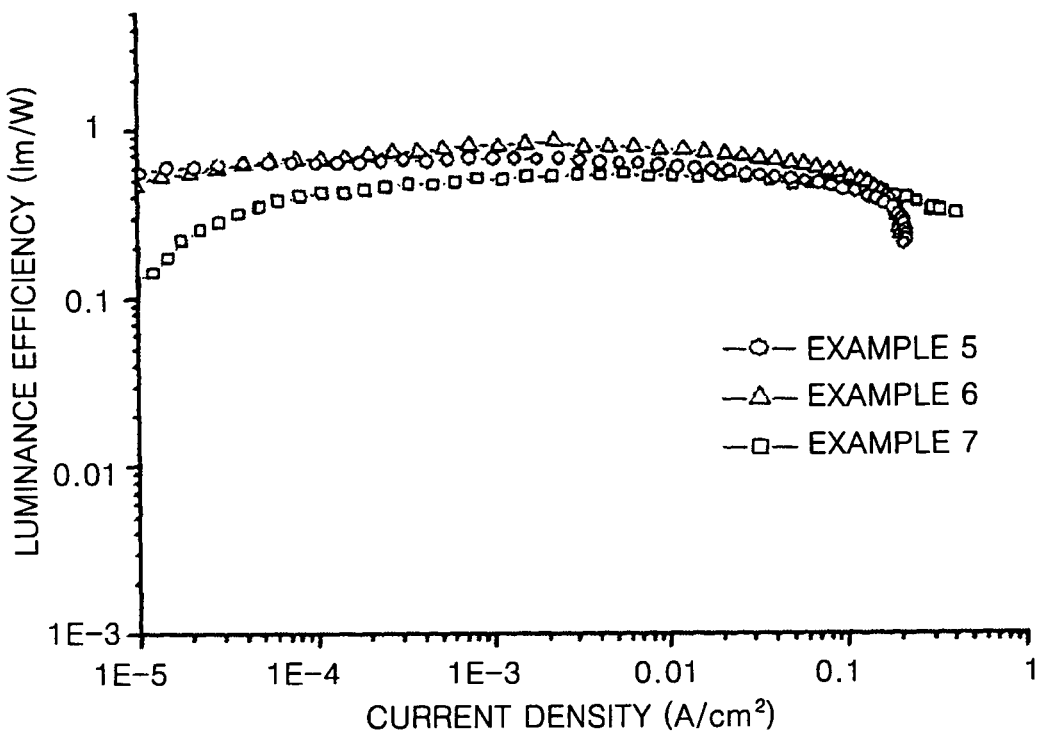
FIG. 8 is a graph of luminance efficiency versus current density of the organic electroluminescent devices using compounds according to embodiments of the present invention.
Figure 9:
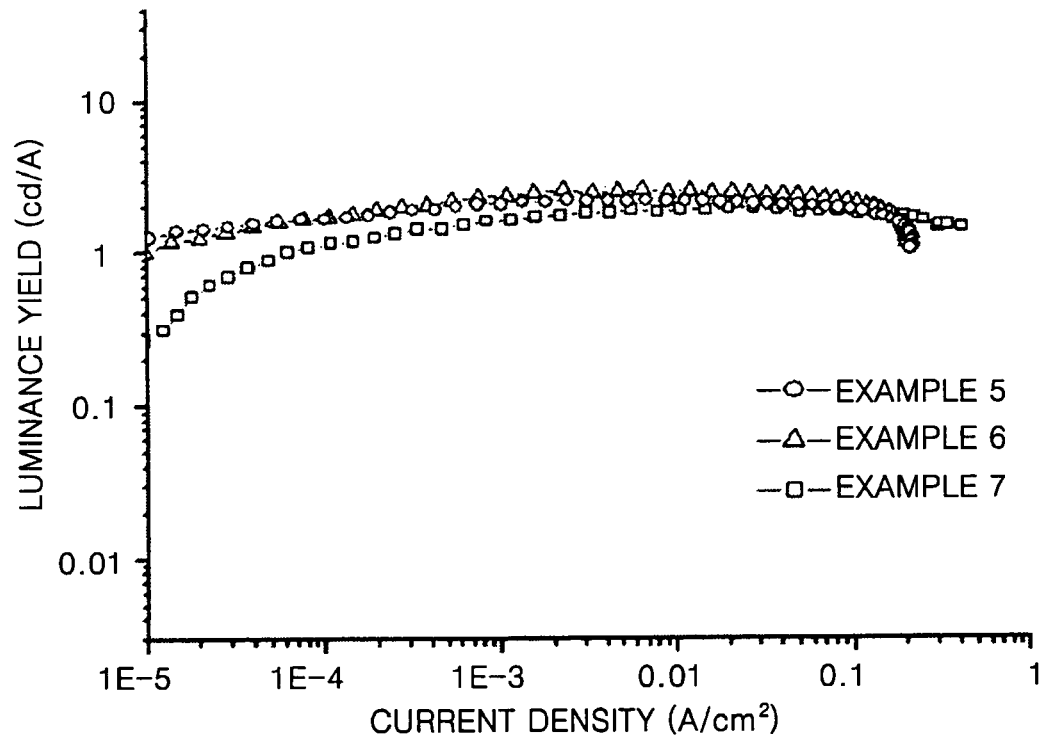
FIG. 9 is a graph of luminance yield versus current density of the organic electroluminescent devices using compounds according to embodiments of the present invention.

External quantum efficiency, luminance efficiency, and efficiency of the organic EL devices according to Examples 5 through 8 were measured, and the results are shown in FIGS. 7 through 9. The organic EL device using the compound according to the present invention as the dopant had excellent external quantum efficiency and luminance efficiency.

An organometallic complex according to the present invention can emit light of a blue region to a red region through a triplet metal-to-ligand charge transfer (MLCT). The organometallic complex, which is a highly efficient phosphorescent material of 400 to 650 nm, can be used to form an emission layer of an organic EL device. In addition, the organometallic complex can be used with a green emission material or a red emission material to emit a white light. The organometlalic complex can be used in a solution process due to its high solubility, and thus, is suitable for a large-scale screen.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organometallic complex represented by Formula 1:

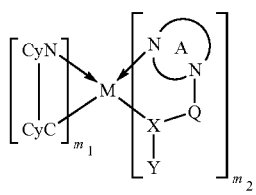

(1)

where M is Ir, Os, Pt, Pb, Re, Ru, or Pd;

CyN is a substituted or non-substituted C3-C60 heterocyclic group containing N that can be bonded to M, or a substituted or non-substituted C3-C60 heteroaryl group containing N that can be bonded to M;

CyC is a substituted or non-substituted C4-C60 carbocyclic group containing C that can be bonded to M, a substituted or non-substituted C3-C60 heterocyclic group containing C that can be bonded to M, a substituted or non-substituted C3-C60 aryl group containing C that can be bonded to M, or a substituted or non-substituted C3-C60 heteroaryl group containing C that can be bonded to M;

CyN-CyC is a cyclometalating ligand that is bonded to M through N and C, wherein substituents of CyN-CyC are each independently a halogen atom, —OR, —N(R)(R'), —P(R)(R'), —POR, —PO$_2$R, —PO$_3$R, —SR, —Si(R)(R')(R''), —B(R)(R'), —B(OR)(OR'), —C(O)R, —C(O)OR, —C(O)N(R), —CN, —NO$_2$, —SO$_2$, —SOR, —SO$_2$R, —SO$_3$R, a substituted or non-substituted C1-C20 alkyl group, or a substituted or non-substituted C6-C20 aryl group where R, R', and R" are each independently hydrogen, a substituted or non-substituted C1-C20 alkyl group, a substituted or non-substituted C1-C10 alkoxy group, a substituted or non-substituted C2-C20 alkenyl group, a substituted or non-substituted C2-C20 alkynyl group, a substituted or non-substituted C1-C20 heteroalkyl group, a substituted or non-substituted C6-C40 aryl group, a substituted or non-substituted C7-C40 arylalkyl group, a substituted or non-substituted C7-C40 alkylaryl group, a substituted or non-substituted C2-C40 heteroaryl group, or a substituted or non-substituted C3-C40 heteroarylalkyl group, and CyN and CyC are connected to form a substituted or non-substituted 4-7 atom cyclic group or a substituted or non-substituted 4-7 atom heterocyclic group;

m$_1$ is an integer from 0 to 2, and m$_2$ is 3-m$_1$;

A is a ligand containing at least two nitrogen atoms, and A is bonded to M through one of said at least two nitrogen atoms;

X is N, S, or P;

Y is selected from the group consisting of hydrogen, a substituted or non-substituted C1-C20 alkyl group, a substituted or non-substituted C1-C10 alkoxy group, a substituted or non-substituted C2-C20 alkenyl group, a substituted or non-substituted C2-C20 alkynyl group, a substituted or non-substituted C1-C20 heteroalkyl group, a substituted or non-substituted C6-C40 aryl group, a substituted or non-substituted C7-C40 arylalkyl group, a substituted or non-substituted C7-C40 alkylaryl group, a substituted or non-substituted C2-C40 heteroaryl group, and a substituted or non-substituted C3-C40 heteroarylalkyl group; and Q is a substituted or non-substituted C1-C20 alkylene group.

2. The organometallic complex of claim 1, wherein the cyclometalating ligand (CyN-CyC) is represented by one of Formulae 1-(i) through 1-(xxviii):

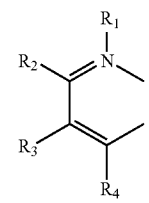

1-(i)

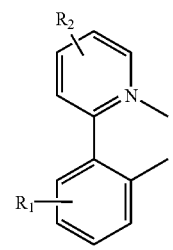

1-(ii)

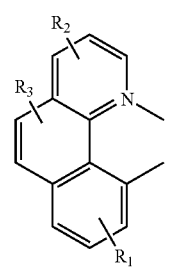

1-(iii)

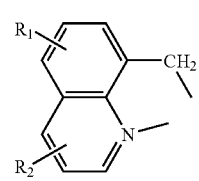

1-(iv)

-continued
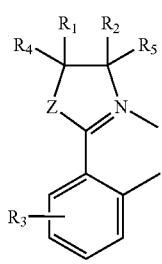
1-(v)
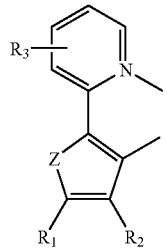
1-(vi)
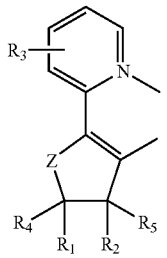
1-(vii)
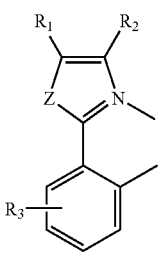
1-(viii)
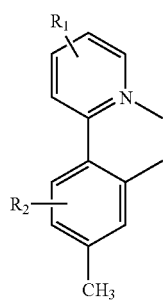
1-(ix)
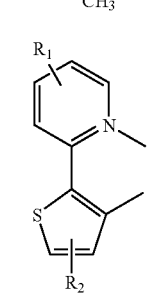
1-(x)
-continued
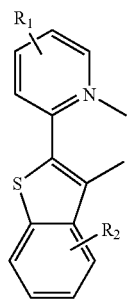
1-(xi)
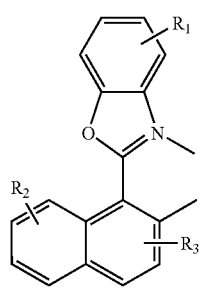
1-(xii)
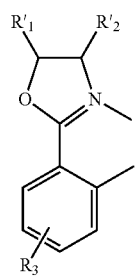
1-(xiii)
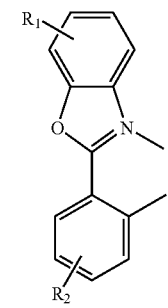
1-(xiv)
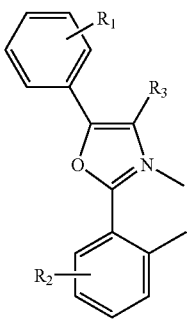
1-(xv)

-continued
1-(xvi)
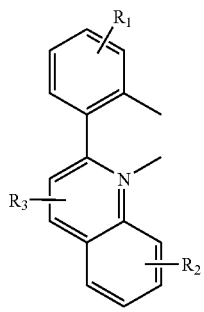
1-(xvii)
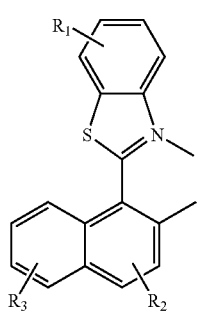
1-(xviii)
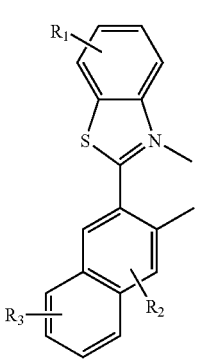
1-(xix)
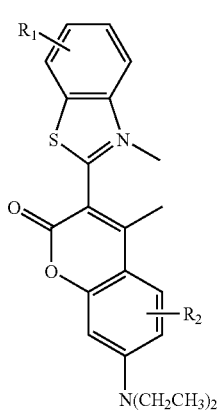
-continued
1-(xx)
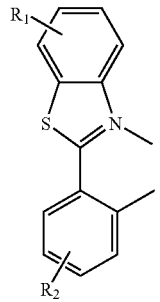
1-(xxi)
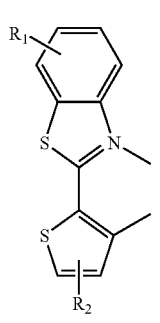
1-(xxii)
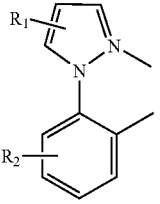
1-(xxiii)
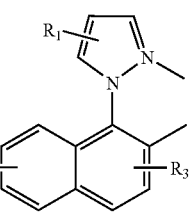
1(xxiv)
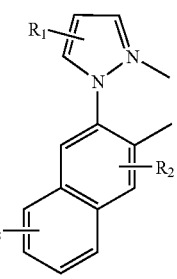
1-(xxv)
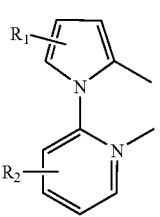

-continued 1-(xxvi)

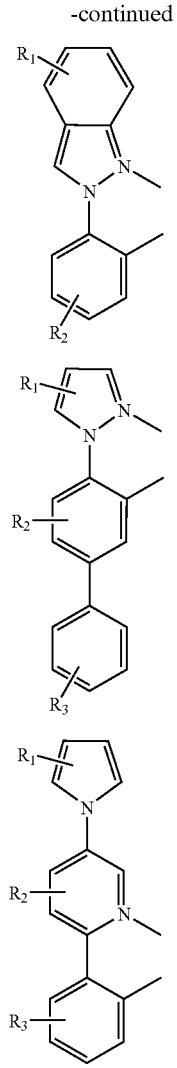

1-(xxvii)

1-(xxviii)

where $R_1$, $R_2$, $R_3$, $R_4$, and $R_5$ are single-substituted or multi-substituted functional groups, and $R_1$, $R_2$, $R_3$, $R_4$, and $R_5$ are each independently H, a halogen atom, —OR, —N(R)$_2$, —P(R)$_2$, —POR, —PO$_2$R, —PO$_3$R, —SR, —Si(R)$_3$, —B(R)$_2$, —B(OR)$_2$, —C(O)R, —C(O)OR, —C(O)N(R), —CN, —NO$_2$, —SO$_2$, —SOR, —SO$_2$R, —SO$_3$R, a C1-C20 alkyl group, or a C6-C20 aryl group, and Z is one of S, O, and NR$_0$ where R$_0$ is H or a C1-C20 alkyl group.

3. The organometallic complex of claim 1, wherein A is a derivative of a compound selected from the group consisting of indazole, imidazole, imidazoline, imidazolyl, imidazole derivative, pyrazole, benzotriazole, benzothaidiazole, oxadiazole, thaiadiazole, pyrazoline, pyrazolidine, benzimidazole, and triazine which are substituted or non-substituted.

4. The organometallic complex of claim 1, wherein A is selected from the group consisting of imidazole, pyrazole, and derivatives of thereof.

5. The organometallic complex of claim 1, wherein M is one of Ir and Pt.

6. The organometallic complex of claim 1, wherein Y is one of hydrogen and a substituted or non-substituted C1-C20 alkyl group.

7. The organometallic complex of claim 1, wherein Q is a C2-C4 alkylene group.

8. The organometallic complex of claim 1, the organometallic complex is a compound represented by Formula 2:

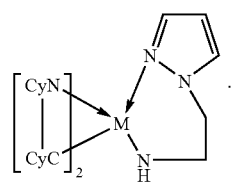

(2)

9. The organometallic complex of claim 1, the organometallic complex selected from the group consisting of compounds represented by Formulae 5 through 16:

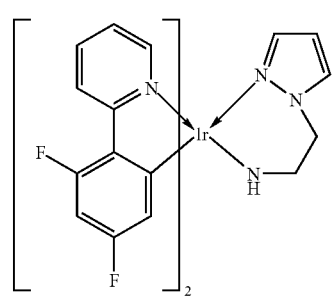

(5)

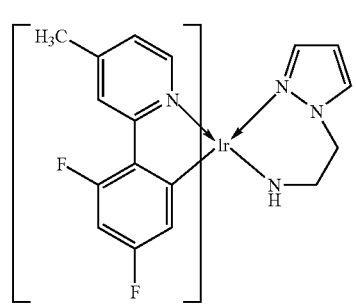

(6)

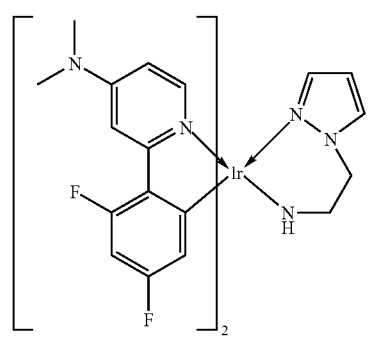

(7)

-continued (8)

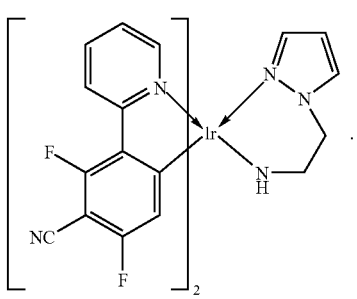

10. The organometallic complex of claim 1, wherein A is selected from the group consisting of imidazole, pyrazole, and derivatives of these, M is Ir or Pt, Y is one of hydrogen and a substituted or non-substituted C1-C20 alkyl group, and Q is a C2-C4 alkylene group.

11. An organic electroluminescent device comprising an organic layer interposed between a pair of electrodes, the organic layer composed of the organometallic complex of claim 1.

12. An organometallic complex represented by Formula 1:

(1)

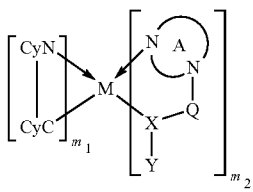

where M is Ir, Os, Pt, Pb, Re, Ru, or Pd;
CyN-CyC is represented by one of Formulae 1-(i) to 1-(xxiii):

1-(i)

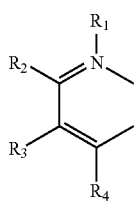

1-(ii)

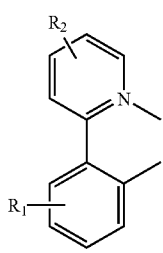

1-(iii)

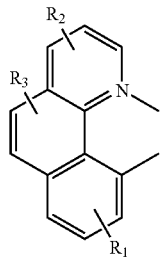

1-(iv)

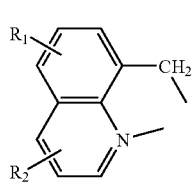

1-(v)

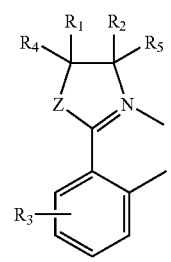

1-(vi)

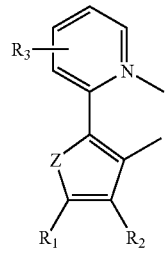

1-(vii)

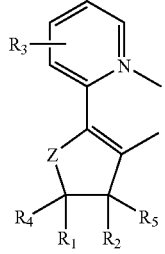

1-(viii)

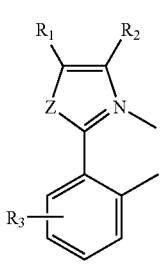

-continued
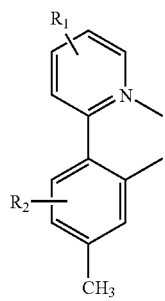 1-(ix)
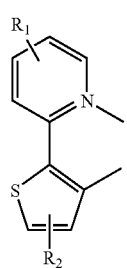 1-(x)
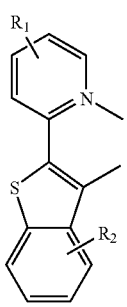 1-(xi)
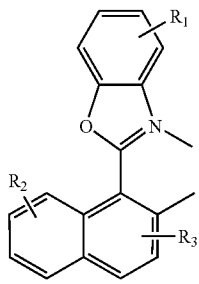 1-(xii)
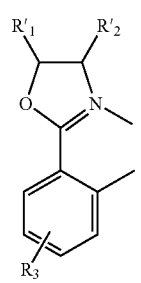 1-(xiii)
-continued
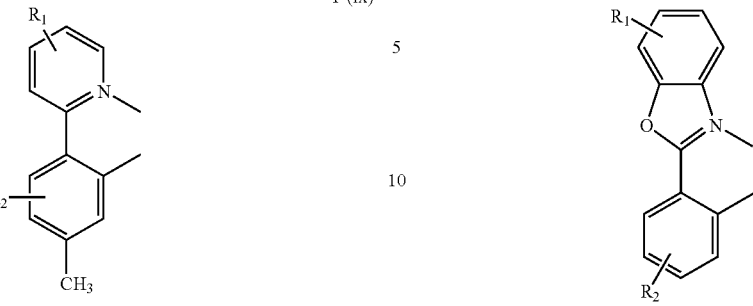 1-(xiv)
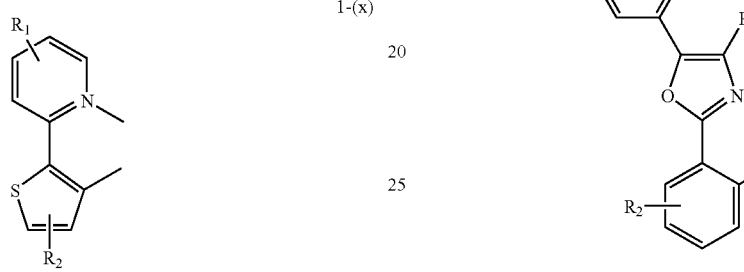 1-(xv)
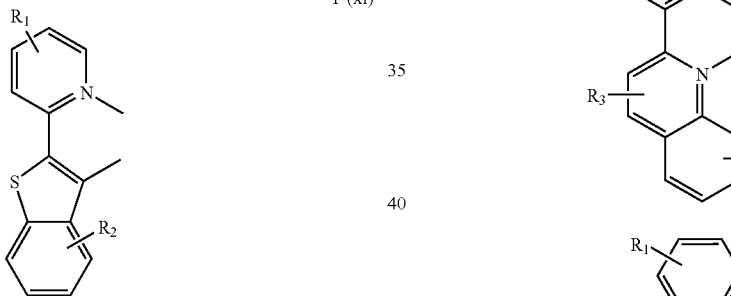 1-(xvi)
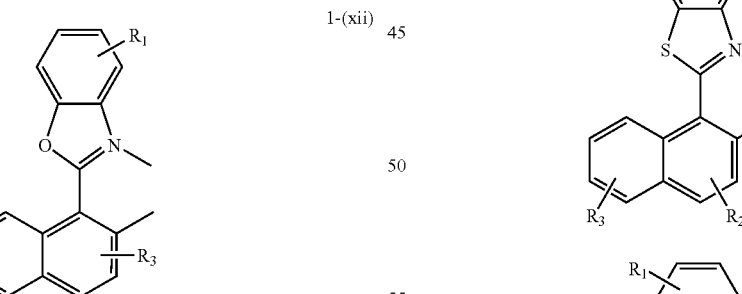 1-(xvii)
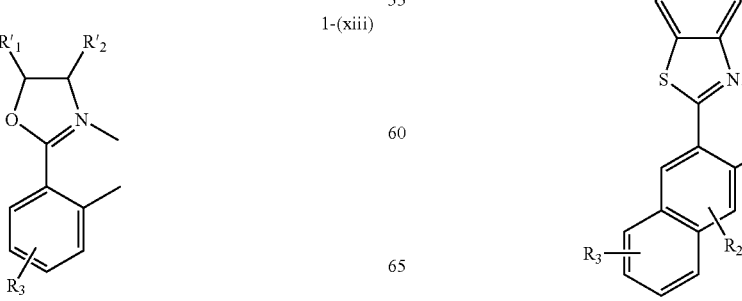 1-(xviii)

-continued
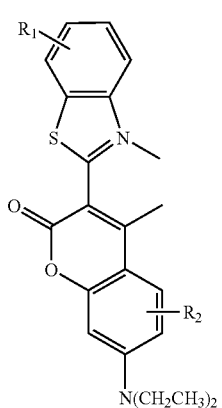 1-(xix)
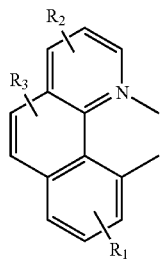 1-(iii)
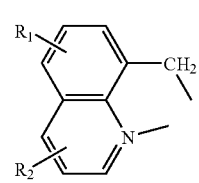 1-(iv)
1-(xx)
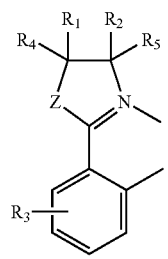 1-(v)
1-(xxi)
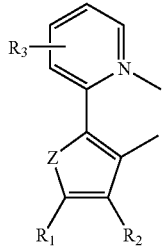 1-(vi)
1-(i)
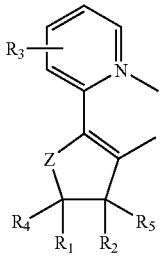 1-(vii)
1-(ii)
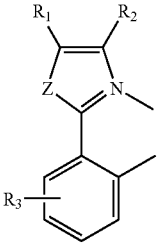 1-(viii)

-continued
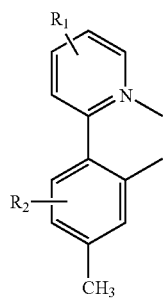
1-(ix)
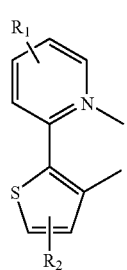
1-(x)
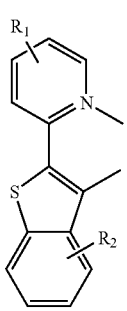
1-(xi)
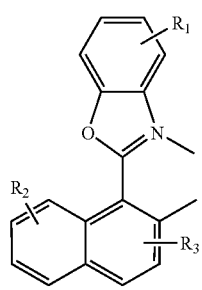
1-(xii)
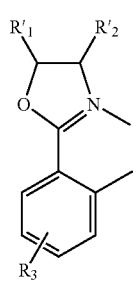
1-(xiii)
-continued
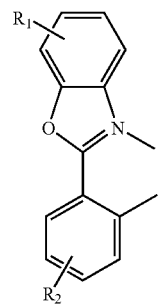
1-(xiv)
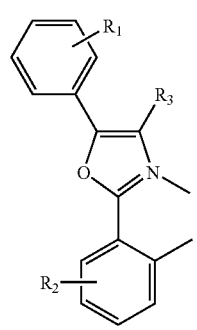
1-(xv)
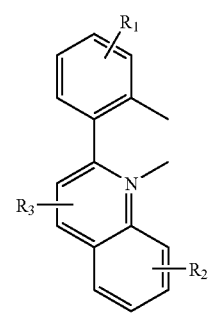
1-(xvi)
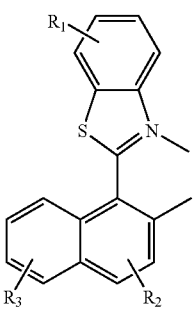
1-(xvii)
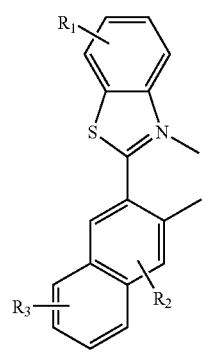
1-(xviii)

-continued
1-(xix)
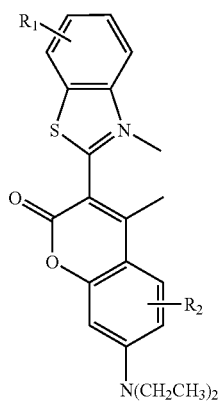
1-(xx)
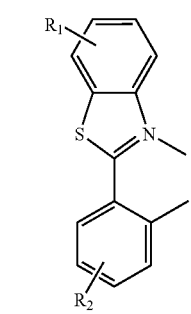
1-(xxi)
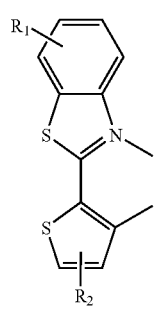
1-(xxii)
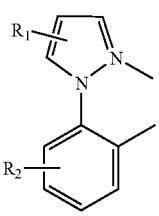
1-(xxiii)
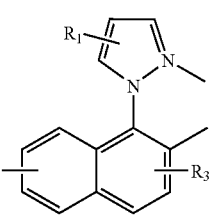
1-(xxiv)
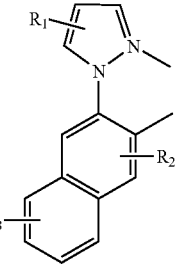
1-(xxv)
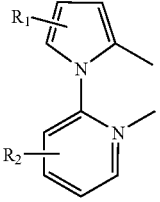
1-(xxvi)
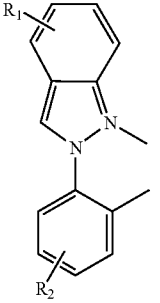
1-(xxvii)
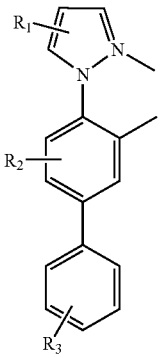
1-(xxviii)
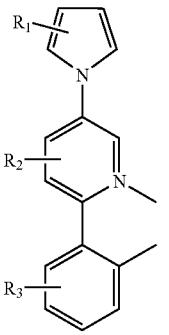
where $R_1$, $R_2$, $R_3$, $R_4$, and $R_5$ are single-substituted or multi-substituted functional groups, and $R_1$, $R_2$, $R_3$, $R_4$, and $R_5$ are each independently H, a halogen atom, —OR, —N(R)$_2$, —P(R)$_2$, —POR, —PO$_2$R, —PO$_3$R, —SR, —Si(R)$_3$, —B(R)$_2$, —B(OR)$_2$, —C(O)R, —C(O)OR, —C(O)N(R), —CN, —NO$_2$, —SO$_2$, —SOR, —SO$_2$R, —SO$_3$R, a C1-C20 alkyl group, or a C6-C20 aryl group, where R is selected from the group consisting of hydrogen, a substituted or non-substituted C1-C20 alkyl group, a substituted or non-substituted C1-C10 alkoxy group, a substituted or non-substituted C2-C20 alkenyl group, a substituted or non-substituted C2-C20 alkynyl group, a substituted or non-substituted C1-C20 heteroalkyl group, a substituted or non-substituted C6-C40 aryl group, a substituted or non-substituted C7-C40 arylalkyl group, a substituted or non-substituted C7-C40 alkylaryl group, a substituted or non-substituted C2-C40 heteroaryl group, and a substituted or non-substituted C3-C40 heteroarylalkyl group, and Z is one of S, O, and NR$_0$ where R$_0$ is H or a C1-C20 alkyl group;

m$_1$ is an integer from 0 to 2, and m$_2$ is 3-m$_1$;

A is a ligand containing at least two nitrogen atoms and A is bonded to M through one of said at least two nitrogen atoms;

X is N, S, or P;

Y is selected from the group consisting of hydrogen, a substituted or non-substituted C1-C20 alkyl group, a substituted or non-substituted C1-C10 alkoxy group, a substituted or non-substituted C2-C20 alkenyl group, a substituted or non-substituted C2-C20 alkynyl group, a substituted or non-substituted C1-C20 heteroalkyl group, a substituted or non-substituted C6-C40 aryl group, a substituted or non-substituted C7-C40 arylalkyl group, a substituted or non-substituted C7-C40 alkylaryl group, a substituted or non-substituted C2-C40 heteroaryl group, and a substituted or non-substituted C3-C40 heteroarylalkyl group; and Q is a substituted or non-substituted C1-C20 alkylene group.

13. The organometallic complex of claim 12, wherein A is selected from the group consisting of imidazole, pyrazole, and derivatives of these, M is Ir or Pt, Y is one of hydrogen and a substituted or non-substituted C1-C20 alkyl group, and Q is a C2-C4 alkylene group.

14. An organic electroluminescent device comprising an organic layer interposed between a pair of electrodes, the organic layer composed of the organometallic complex of claim 12.

15. An organic electroluminescent device, comprising:
a pair of electrodes; and
an organic layer interposed between the pair of electrodes, the organic layer composed of the organometallic complex represented by Formula 1

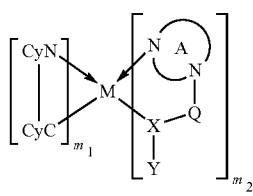

(1)

where M is Ir, Os, Pt, Pb, Re, Ru, or Pd;
CyN is a substituted or non-substituted C3-C60 heterocyclic group containing N that can be bonded to M, or a substituted or non-substituted C3-C60 heteroaryl group containing N that can be bonded to M;

CyC is a substituted or non-substituted C4-C60 carbocyclic group containing C that can be bonded to M, a substituted or non-substituted C3-C60 heterocyclic group containing C that can be bonded to M, a substituted or non-substituted C3-C60 aryl group containing C that can be bonded to M, or a substituted or non-substituted C3-C60 heteroaryl group containing C that can be bonded to M;

CyN-CyC is a cyclometalating ligand that is bonded to M through N and C, wherein substituents of CyN-CyC are each independently a halogen atom, —OR, —N(R)(R'), —P(R)(R), —POR, —PO$_2$R, —PO$_3$R, —SR, —Si(R)(R')(R''), —B(R)(R'), —B(OR)(OR'), —C(O)R, —C(O)OR, —C(O)N(R), —CN, —NO$_2$, —SO$_2$, —SOR, —SO$_2$R, —SO$_3$R, a substituted or non-substituted C1-C20 alkyl group, or a substituted or non-substituted C6-C20 aryl group where R, R', and R'' are each independently hydrogen, a substituted or non-substituted C1-C20 alkyl group, a substituted or non-substituted C1-C10 alkoxy group, a substituted or non-substituted C2-C20 alkenyl group, a substituted or non-substituted C2-C20 alkynyl group, a substituted or non-substituted C1-C20 heteroalkyl group, a substituted or non-substituted C6-C40 aryl group, a substituted or non-substituted C7-C40 arylalkyl group, a substituted or non-substituted C7-C40 alkylaryl group, a substituted or non-substituted C2-C40 heteroaryl group, or a substituted or non-substituted C3-C40 heteroarylalkyl group, and CyN and CyC are connected to form a substituted or non-substituted 4-7 atom cyclic group or a substituted or non-substituted 4-7 atom heterocyclic group;

m$_1$ is an integer from 0 to 2, and m$_2$ is 3-m$_1$;

A is a ligand containing at least two nitrogen atoms, and A is bonded to M through one of said at least two nitrogen atoms;

X is N, S, or P;

Y is selected from the group consisting of hydrogen, a substituted or non-substituted C1-C20 alkyl group, a substituted or non-substituted C1-C10 alkoxy group, a substituted or non-substituted C2-C20 alkenyl group, a substituted or non-substituted C2-C20 alkynyl group, a substituted or non-substituted C1-C20 heteroalkyl group, a substituted or non-substituted C6-C40 aryl group, a substituted or non-substituted C7-C40 arylalkyl group, a substituted or non-substituted C7-C40 alkylaryl group, a substituted or non-substituted C2-C40 heteroaryl group, and a substituted or non-substituted C3-C40 heteroarylalkyl group; and Q is a substituted or non-substituted C1-C20 alkylene group.

16. The organic electroluminescent device of claim 15, wherein the amount of the organometallic complex is in the range of 1 to 30 parts by weight based on 100 parts by weight of the total amount of an emission layer forming material.

17. The organic electroluminescent device of claim 15, wherein the organic layer is further composed of at least one host selected from the group consisting of at least one polymer host, a mixture host of a polymer host and a low molecular weight host, a low molecular weight host, and a non-emission polymer matrix.

18. The organic electroluminescent device of claim 15, wherein the organic layer is further composed of one of a green emission material and a red emission material.

19. The organic electroluminescent device of claim 15, wherein A is selected from the group consisting of imidazole, pyrazole, and derivatives of these, M is Ir or Pt, Y is one of hydrogen and a substituted or non-substituted C1-C20 alkyl group, and Q is a C2-C4 alkylene group.

20. The organic electroluminescent device of claim 15, wherein the organic electroluminescent device is capable of emitting light of 400 nm to 650 nm.

* * * * *